US012677710B2

(12) United States Patent
Wu

(10) Patent No.: US 12,677,710 B2
(45) Date of Patent: Jul. 7, 2026

(54) ALL-INORGANIC UP-CONVERSION DISPLAY

(71) Applicant: National Tsing Hua University, Hsinchu City (TW)

(72) Inventor: Meng-Chyi Wu, Hsinchu City (TW)

(73) Assignee: NATIONAL TSING HUA UNIVERSITY, Hsinchu City (TW)

( * ) Notice: Subject to any disclaimer, the term of this patent is extended or adjusted under 35 U.S.C. 154(b) by 518 days.

(21) Appl. No.: 18/461,934

(22) Filed: Sep. 6, 2023

(65) Prior Publication Data

US 2024/0387494 A1     Nov. 21, 2024

(30) Foreign Application Priority Data

May 17, 2023     (TW) .................................. 112118284

(51) Int. Cl.
*H10W 90/00* (2026.01)
*H10F 39/00* (2025.01)
(Continued)

(52) U.S. Cl.
CPC .......... *H10W 90/00* (2026.01); *H10F 39/182* (2025.01); *H10F 39/811* (2025.01);
(Continued)

(58) Field of Classification Search
CPC . H10W 90/00; H10W 72/242; H10W 72/342; H10W 90/722; H10W 90/732;
(Continued)

(56) References Cited

U.S. PATENT DOCUMENTS

2014/0159183 A1*  6/2014  Na ........................ H10F 77/206
                                                    257/432
2015/0008390 A1*  1/2015  Lewis ..................... H10F 55/00
                                                    438/24
(Continued)

FOREIGN PATENT DOCUMENTS

CN          111864007 A  * 10/2020  ........... H10F 55/165
JP          2017028289 A  * 2/2017   ........... H04W 88/02
(Continued)

*Primary Examiner* — Fatima N Farokhrooz
(74) *Attorney, Agent, or Firm* — Birch, Stewart, Kolasch & Birch, LLP

(57)          ABSTRACT

An all-inorganic up-conversion display includes a photo-diode array and a light emitting diode array. The photodiode array includes a first substrate having a first conductivity type, a buffer layer formed on a first surface of the first substrate, an absorption layer formed on the buffer layer, a cap layer formed on the absorption layer, a first patterned passivation layer formed on the cap layer and exposing an array of contact regions of the cap layer, a common first electrode connected to the first substrate, an array of second electrodes, and an array of first solder bumps. The light emitting array includes a second substrate, an array of luminous chips, a common third electrode, a second patterned passivation layer, and an array of second solder bumps. Each of the first solder bumps is flip-chip bonded to a corresponding one of the second solder bumps.

8 Claims, 16 Drawing Sheets
(4 of 16 Drawing Sheet(s) Filed in Color)

(51) Int. Cl.
*H10F 39/18* (2025.01)
*H10H 29/14* (2025.01)
*H10W 72/20* (2026.01)

(52) U.S. Cl.
CPC ........ *H10H 29/142* (2025.01); *H10W 72/242* (2026.01); *H10W 72/252* (2026.01); *H10W 90/722* (2026.01)

(58) Field of Classification Search
CPC . H10W 72/252; H10H 29/142; H10F 39/182; H10F 39/811; H10F 39/184; H10F 39/1847
See application file for complete search history.

(56) References Cited

U.S. PATENT DOCUMENTS

| | | | |
|---|---|---|---|
| 2020/0303471 A1* | 9/2020 | Akimoto | H10H 20/018 |
| 2020/0343232 A1* | 10/2020 | Wu | H10F 39/184 |
| 2021/0407764 A1* | 12/2021 | King | H01J 37/304 |
| 2023/0134894 A1* | 5/2023 | Hamer | G02F 1/39 |
| | | | 257/40 |

FOREIGN PATENT DOCUMENTS

| | | | |
|---|---|---|---|
| JP | 2018049071 A | * | 3/2018 |
| WO | WO 2006/011766 A1 | | 2/2006 |

* cited by examiner

ALL-INORGANIC UP-CONVERSION DISPLAY

CROSS-REFERENCE TO RELATED APPLICATION

This application claims priority to Taiwanese Invention Patent Application No. 112118284, filed on May 17, 2023.

FIELD

The disclosure relates to an up-conversion display, and more particularly to an all-inorganic up-conversion display.

BACKGROUND

Up-conversion elements (also known as up-converters), which are widely known to the public, can generally be divided into four types, i.e., an inorganic photodiode integrated with an inorganic light-emitting diode (a PD-LED module), an inorganic photodiode integrated with an organic light-emitting diode (a PD-OLED module), an organic photodiode integrated with an organic light-emitting diode (an OPD-OLED module), and a colloidal quantum dot (CQD)-containing element.

There are two methods of manufacturing the up-conversion elements by utilizing group Ill-V compound semiconductors, which belong to inorganic compound semiconductors. One method is to epitaxially grow the film structures of an LED and of a PD directly on the same substrate during the epitaxy stage, and another method is to wafer fuse an LED epitaxial wafer and a PD epitaxial wafer so that the LED and the PD epitaxial wafers are bonded together for performing subsequent processes. For the former method, due to a lattice-match requirement, a special consideration needs to be given to the selection of materials, and the composition ratios and the bandgaps of materials. For the latter method, a proper selection of temperature, pressure and gases is necessary for carrying out wafer fusion so that the LED epitaxial wafer and the PD epitaxial wafer can be well bonded together; otherwise wafer cracking or interface defects caused by an improper temperature or pressure may occur. As a result, currently available up-conversion elements manufactured by the latter, i.e., by wafer fusion and bonding, generally have a maximum size of merely 1 mm×1 mm. In addition, the yield and the photoelectric conversion efficiency of the thus produced up-conversion elements are low, and hence the latter method is only feasible on a laboratory scale but not practicable for large-scale manufacturing.

Nowadays, approximately all up-conversion displays are made of all-organic up-conversion elements or all-organic up-conversion elements containing CQDs. An organic up-conversion element or an OLED tends to carry a vertical current flow, and thus may be directly used to fabricate a non-pixel display with a large area. Nevertheless, the light emitting bands of such a display is generally limited within the green light range or part of the red light range. Moreover, the irradiation source for such a display is also limited to an infrared laser light having a wavelength of not greater than 1000 nm, and the photoelectric conversion efficiency thereof is almost less than 10%. Currently, the largest light-to-light 3-dB frequency is only 20 KHz. Furthermore, the imaging using such non-pixel display merely involves allowing the infrared laser light to pass through an English letter aperture in a black film therein, which may be a challenge for practical applications. Although manufacturing of the all-organic up-conversion elements or the OPD-OLED modules has a less stringent requirement for lattice matching compared to those of manufacturing of inorganic semiconductors, organic layers can have undesirable interfaces and may cause a large lateral diffusion current and current leakage. Therefore, there still exists problems, such as, a low up-conversion efficiency from infrared to visible light, and a demand for using a high bias voltage, etc.

Up-conversion elements can be widely applied in a variety of fields, such as in night display systems, biomedical image inspection, and pathological tests. Accordingly, the relevant industry seeks to improve the currently-used up-conversion elements so as to expand their use in more fields. Compared with the organic up-conversion element, an all-inorganic PD-LED module, for example, the light conversion element disclosed in TW 1684801, has superior photoelectric characteristic. However, the various hindrances encountered during the processes of manufacturing an all-inorganic up-conversion element, as mentioned above, are gradually forcing the abandonment of utilizing such element.

It can be inferred from the preceding description that it is truly a big challenge for those skilled in the art to overcome the problems caused by lattice mismatch in the all-inorganic up-conversion element, and to reduce the driving voltage, as well as to improve the light-to-light frequency response thereof.

SUMMARY

Therefore, an object of the disclosure is to provide an all-inorganic up-conversion display that can alleviate at least one of the drawbacks of the prior art.

According to the disclosure, the all-inorganic up-conversion display includes a photodiode array and a light emitting diode array.

The photodiode array includes a first substrate having a first conductivity type, a buffer layer formed on a first surface of the first substrate, an absorption layer formed on the buffer layer, a cap layer formed on the absorption layer, a first patterned passivation layer formed on the cap layer and exposing an array of contact regions of the cap layer, a common first electrode connected to the first substrate, an array of second electrodes, and an array of first solder bumps. The common first electrode has the first conductivity type. Each of the contact regions of the cap layer has a second conductivity type that is opposite to the first conductivity type. Each of the second electrodes is connected to a corresponding one of the contact regions and has the second conductivity type, and each of the first solder bumps is connected to a corresponding one of the second electrodes.

The light emitting diode array includes a second substrate, an array of luminous chips, a common third electrode, a second patterned passivation layer, and an array of second solder bumps. Each of the luminous chips includes a first semiconductor layer formed on the second substrate and having the first conductivity type, a second semiconductor layer formed on the first semiconductor layer and having the second conductivity type, an active layer disposed between the first semiconductor layer and the second semiconductor layer, and a pixel electrode having the second conductivity type and electrically connected to the semiconductor second layer. The first semiconductor layers of the luminous chips are connected to one another. The common third electrode has the first conductivity type, is disposed on the first semiconductor layers of the luminous chips, and surrounds each of the active layers. The second patterned passivation layer covers the array of the luminous chips and the common third electrode, and exposes each of the pixel electrodes of the luminous chips and an end of the common third electrode. In addition, each of the second solder bumps is connected to a corresponding one of the pixel electrodes.

Furthermore, each of the first solder bumps is flip-chip bonded to a corresponding one of the second solder bumps.

BRIEF DESCRIPTION OF THE DRAWINGS

The patent or application file contains at least one color drawing. Copies of this patent or patent application publication with color drawing will be provided by the USPTO upon request and payment of the necessary fee.

Other features and advantages of the disclosure will become apparent in the following detailed description of the embodiment(s) with reference to the accompanying drawings. It is noted that various features may not be drawn to scale.

DETAILED DESCRIPTION

Figure 1:
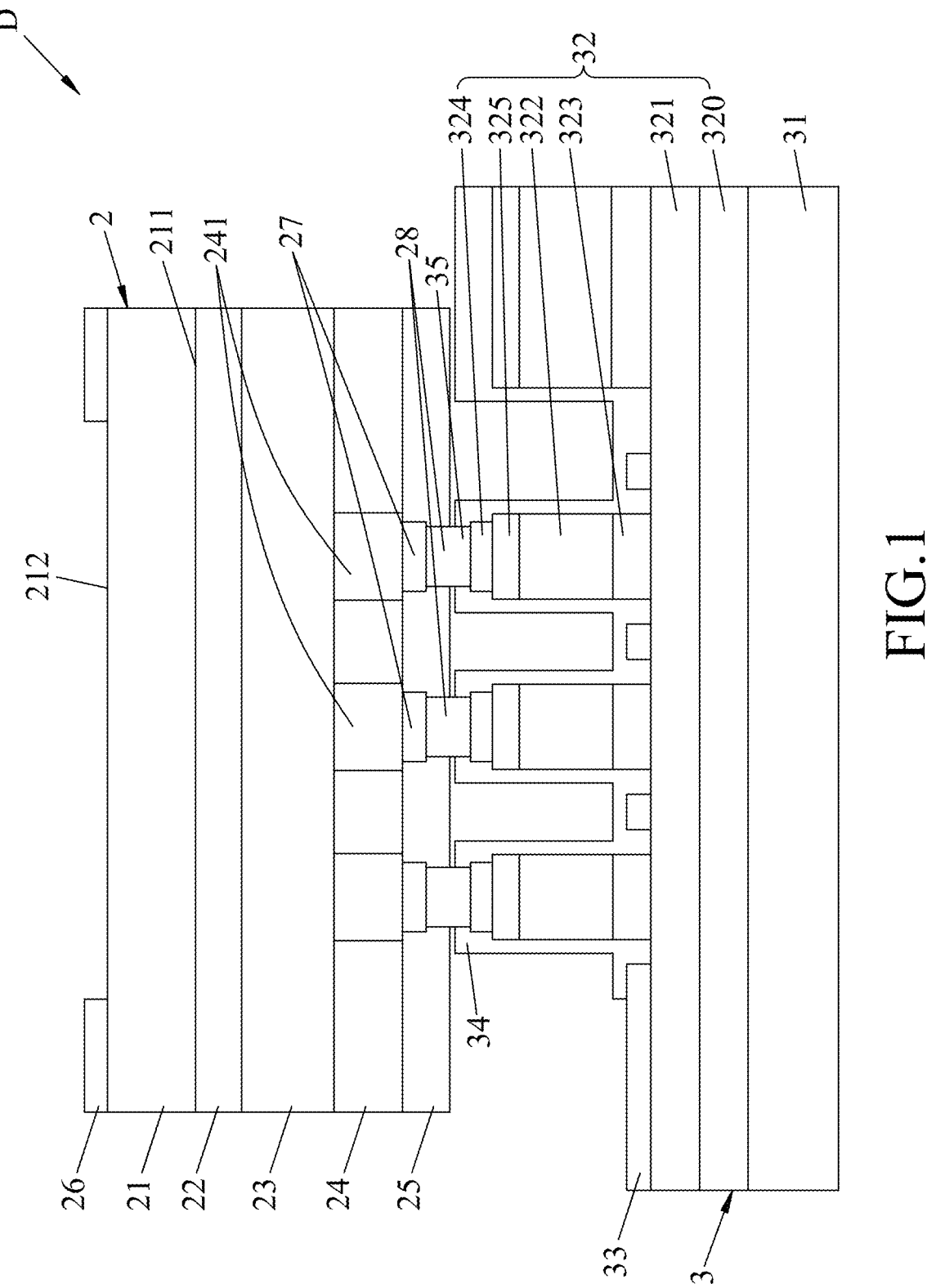
FIG. 1 is a cross-sectional view illustrating an embodiment of an all-inorganic up-conversion display according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, an embodiment of an all-inorganic up-conversion display (D) according to the disclosure includes a photodiode array 2 and a light emitting diode array 3.

The photodiode array 2 includes a first substrate 21 having a first conductivity type, a buffer layer 22 formed on a first surface 211 of the first substrate 21, an absorption layer 23 formed on the buffer layer 22, a cap layer 24 formed on the absorption layer 23, a first patterned passivation layer 25 formed on the cap layer 24 and exposing an array of contact regions 241 of the cap layer 24, a common first electrode 26 connected to the first substrate 21, an array of second electrodes 27, and an array of first solder bumps 28. The common first electrode 26 of the photodiode array 2 has the first conductivity type. Each of the contact regions 241 of the cap layer 24 has a second conductivity type that is opposite to the first conductivity type. Each of the second electrodes 27 of the photodiode array 2 is connected to a corresponding one of the contact regions 241 and has the second conductivity type. In addition, each of the first solder bumps 28 of the photodiode array 2 is connected to a corresponding one of the second electrodes 27. In certain embodiments, the common first electrode 26 of the photodiode array 2 may be formed on a second surface 212 of the first substrate 21 opposite to the first surface 211.

In this embodiment, the photodiode array 2 may be made principally of Group IV semiconductor materials, or may be avalanche photodiodes (APDs) or positive-intrinsic-negative photodiodes (P-I-N PDs), both of which are made of Group Ill-V semiconductor materials.

The light emitting diode array 3 includes a second substrate 31, an array of luminous chips 32, a common third electrode 33, a second patterned passivation layer 34, and an array of second solder bumps 35. Each of the luminous chips 32 includes a buffer layer 320 formed on the second substrate 31, a first semiconductor layer 321 formed on the buffer layer 320 and having the first conductivity type, a second layer 322 formed on the first semiconductor layer 321 and having the second conductivity type, an active layer 323 disposed between the first semiconductor layer 321 and the second semiconductor layer 322, and a pixel electrode 324 having the second conductivity type and electrically connected to the second semiconductor layer 322. The first semiconductor layers 321 of the luminous chips 32 is connected to one another. The common third electrode 33 of the light emitting diode array 3 has the first conductivity type and is disposed on the first semiconductor layers 321 of the luminous chips 32, so as to surround each of the active layers 323. The second patterned passivation layer 34 of the light emitting diode array 3 covers the array of the luminous chips 32 and the common third electrode 33, and exposes each of the pixel electrodes 324 of the luminous chips 32 and an end of the common third electrode 33. Moreover, each of the second solder bumps 35 of the light emitting diode array 3 is connected to a corresponding one of the pixel electrodes 324. According to the disclosure, each of the first solder bumps 28 of the photodiode array 2 is flip-chip bonded to a corresponding one of the second solder bumps 35 of the light emitting diode array 3.

In certain embodiments, each of the luminous chips 32 may further include a current spreading layer 325, which is disposed between the pixel electrode 324 and the second semiconductor layer 322. In certain embodiments, each of the first solder bumps 28 of the photodiode array 2 and the second solder bumps 35 of the light emitting diode array 3 may be made of a metal material selected from the group consisting of indium (In), gold (Au), tin (Sn), a gold-indium alloy, a gold-tin alloy, an indium-tin alloy, a gold-indium-tin alloy, a tin-lead alloy, a gold-germanium alloy, and a gold-silicon alloy.

In other embodiments, the first conductivity type of the first substrate 21 of the photodiode array 2 may be an n-type, the second conductivity type of the contact regions 241 of the cap layer 24 may be a p-type, the common first electrode 26 of the photodiode array 2 may be a common cathode, and each of the second electrodes 27 may be an anode. In still other embodiments, the first conductivity type in each of the first semiconductor layers 321 of the array of the luminous chips 32 may be an n-type, the second conductivity type in each of the second semiconductor layers 322 may be a p-type, the common third electrode 33 may be a common cathode, and the pixel electrode 324 of each of the luminous chips 32 may be a pixel anode.

In some embodiments, the photodiode array 2 may be one of a mini photodiode array and a micro photodiode array (micro PDs), and the light emitting diode array 3 may be one of a mini light emitting diode array and a micro light emitting diode array (micro LEDs). In this embodiment, the photodiode array 2 and the light emitting diode array 3 merely serve for exemplification purposes and are not a limitation of the disclosure.

In an exemplary embodiment, the all-inorganic up-conversion display (D) is a 512×512 matrix array of pixels. In this exemplary embodiment, a solder bump on each anode of a 512×512 PD array 2 (specifically a P-I-N planar micro PD array denoted by reference numeral 4 in FIG. 2) is flip-chip bonded to a solder bump of a corresponding pixel anode of a 512×512 LED array 3 (specifically, an array denoted by reference numeral 5 in FIG. 3 and an array denoted by reference number 6 in FIG. 4). The all-inorganic up-conversion display (D) has a pixel size of 15 μm and an array pitch of 21 μm, and has a resolution of up to 1210 pixel per inch (PPI). These characteristic parameters of the 512×512 all-inorganic up-conversion display (D) may be obtained by measuring the same through an electrical property analysis, so as to allow a back-end application after the 512×512 all-inorganic up-conversion display (D) is manufactured. Specifically, The 512×512 all-inorganic up-conversion display (D) includes a shortwave infrared (SWIR) inorganic (i.e., InGaAs/InP) micro PD array 4 (see FIG. 2, only a part of the SWIR inorganic micro PD array 4 is shown), an AlGaInP-based micro LED array 5 (see FIG. 3, only a part of the AlGaInP-based micro LED array 5 is shown), and a GaInN-based micro LED array 6 (see FIG. 4, only a part of the GaInN-based micro LED array 6 is shown), wherein solder bumps on some anodes of the SWIR inorganic micro PD array 4 are respectively flip-chip bonded to solder bumps on the anodes of the AlGaInP-based micro LED array 5, and solder bumps on the remaining anodes of the SWIR inorganic micro PD array 4 are respectively flip-chip bonded to solder bumps on the anodes of the GaInN-based micro LED array 6. A manufacturing method of the 512×512 all-inorganic up-conversion display (D) of this example is described in detail as follows.

<Preparation of SWIR Inorganic Micro PD Array 4>

Figure 2:
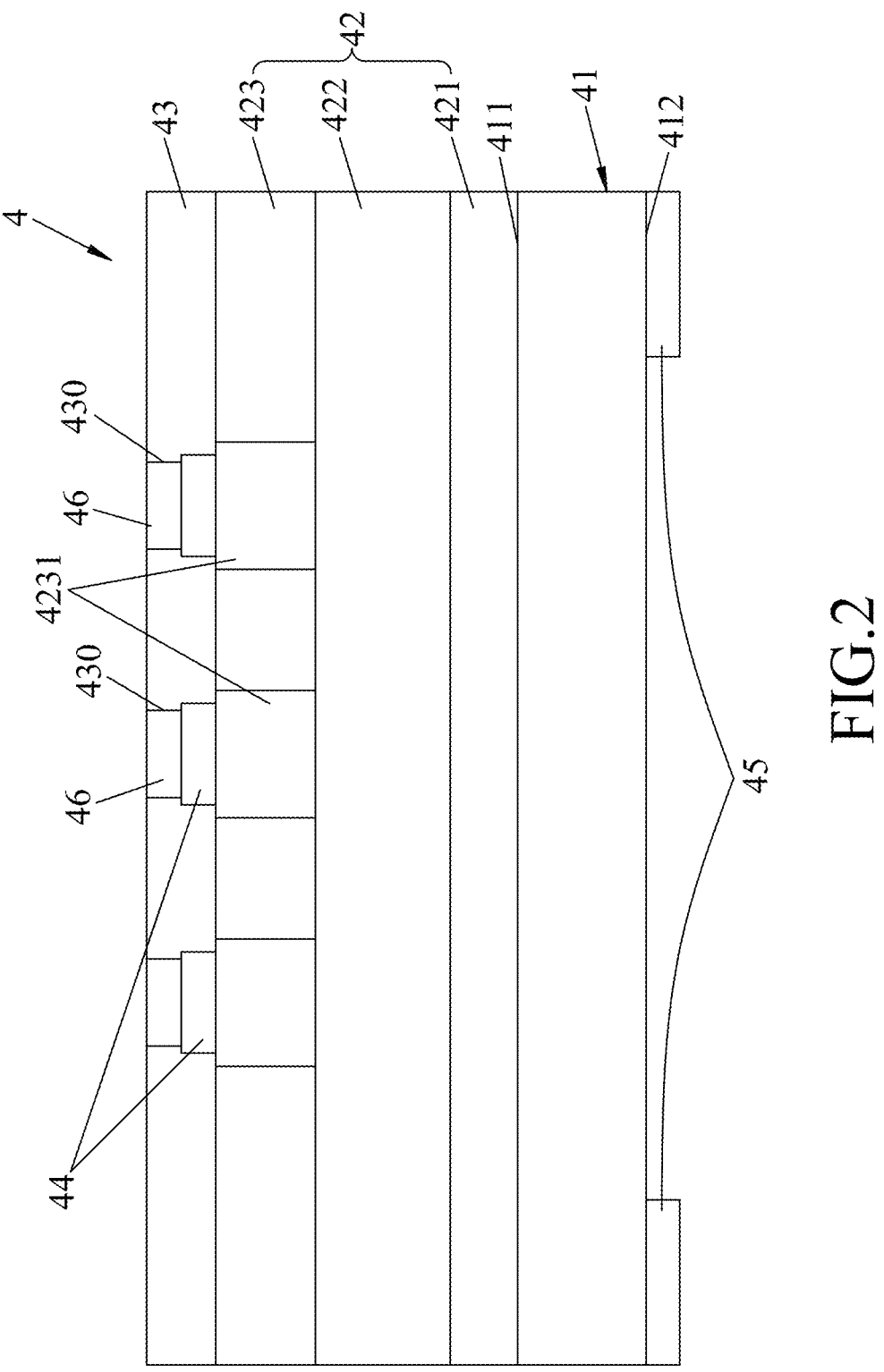
FIG. 2 is a cross-sectional view illustrating a film structure of an example of a shortwave infrared (SWIR) inorganic micro photodiode (micro PD) array used in the all-inorganic up-conversion display of the embodiment shown in FIG. 1.

Referring to FIG. 2, for fabricating the SWIR inorganic micro PD array 4, a film structure 42 is first epitaxially grown on an upper surface 411 of an S-doped $n^+$-InP(100) substrate 41 by metal-organic chemical vapor deposition (MOCVD), so as to sequentially form an undoped InP buffer layer 421 having a thickness of 0.5 μm, an undoped $In_{0.53}Ga_{0.47}As$ absorption layer 422 having a thickness of 3 μm, and an undoped InP cap layer 423 having a thickness of 1 μm thereon. The undoped $In_{0.53}Ga_{0.47}As$ absorption layer 422 designed with the 3 μm thickness may provide an expected higher photocurrent so as to provide higher photoresponsivity.

Afterward, an SiNx dielectric layer having a thickness of 300 nm is deposited on the undoped InP cap layer 423 by plasma-enhanced chemical vapor deposition (PECVD) using 20 W plasma power at 300° C. The SiNx dielectric layer may serve as a mask against rapid thermal diffusion (RTD) that is performed subsequently, and eventually serve as an SiNx passivation layer 43 for the SWIR inorganic micro PD array 4. Processing steps for making the p-type contact regions for the SWIR inorganic micro PD array 4 (P-I-N mesa-type micro PDs) include: (a) conducting a window opening process; (b) conducting a Zinc (Zn) drive-in process; and (c) conducting a wet etching process, and are described in detail as follows. It should be noted that the SiNx passivation layer 43 having the thickness of 300 nm is formed in two stages, each of which results in a thickness of 150 nm.

The window opening process of the SWIR inorganic micro PD array 4 is to allow the S-doped $n^+$-InP(100) substrate 41, after completing the formation of the SiNx passivation layer 43 (first stage), to be immersed in an acetone/isopropanol (hereinafter referred to as "ACE/IPA") solution for 5 minutes, followed by rinsing with deionized water for 3 minutes and then drying utilizing a nitrogen gun. Next, a first SiO₂ layer (not shown) was deposited on the SiNx passivation layer 43 (first stage), and then a first patterned negative photoresist layer (not shown) is formed on the first SiO₂ layer through photolithography, thereby partially exposing the first SiO₂ layer therefrom. Afterwards, the first SiO₂ layer that is exposed from the first patterned negative photoresist layer and the SiNx passivation layer 43 (first stage) below thereof are removed by reactive ion etching (RIE), followed by peeling off the first patterned negative photoresist layer, thereby forming an array of window openings which expose the undoped InP cap layer 423 and which are defined by the etched portions of the first SiO₂ layer and the SiNx passivation layer 43 (first stage, having a thickness of 150 nm). Each of the window openings has a diameter of 15 μm, and two adjacent window openings has a distance of 21 μm.

The Zn drive-in process for the SWIR inorganic micro PD array 4 is to allow the S-doped $n^+$-InP(100) substrate 41, after completing the formation of the array of window openings, to be immersed in an ACE/IPA solution for 5 minutes, followed by rinsing with deionized water for 3 minutes and then drying utilizing the nitrogen gun. Next, a zinc phosphorus dopant coating (hereinafter referred to as "ZPDC") serving as a Zn dopant source is coated on a sapphire wafer (not shown) so that the sapphire wafer coated with the ZPDC can serve as a source wafer, wherein the ZPDC is an organic solvent mixture containing Zn and phosphorus (P) dopants. Subsequently, the source wafer was placed on a heating plate (200° C.) and heated for 3 minutes, followed by directing the source wafer to face the first SiO₂ layer already formed above the S-doped $n^+$-InP(100) substrate 41 and placing the ZPDC of the source wafer face-to-face adjacent with the first SiO₂ layer. After that, the ZPDC of the source wafer and the first SiO₂ layer (closely facing each other) are placed in a nearly airtight graphite fixture (not shown), and then heated within a rapid thermal annealing (RTA) furnace at 540° C. for 30 seconds (heating rate: 20° C./sec) to perform RTD. The RTA furnace contained nitrogen gas, so that the Zn in the ZPDC can be diffused in a vapor form into the window openings from the first SiO₂ layer to the undoped InP cap layer 423, thereby forming an array of $p^+$-InP contact regions 4231 for the SWIR inorganic micro PD array 4. Additionally, each of the $p^+$-InP contact regions 4231 has a hole concentration of approximately $5×10^{18}$ cm⁻³.

The wet etching process for the SWIR inorganic micro PD array 4 is to allow the S-doped $n^+$-InP(100) substrate 41, after completing the formation of the $p^+$-InP contact regions 4231, to be immersed in a buffered oxide etchant (BOE) solution for 20 seconds so that the first SiO₂ layer was etched away, followed by rinsing with deionized water for 3 minutes and then drying utilizing the nitrogen gun.

Afterward, a P-metal deposition process was implemented following the completion of formation of the p-type contact regions (i.e., the $p^+$-InP contact regions 4231) of the arrays of SWIR inorganic micro PD array 4. Specifically, in the P-metal deposition process, a second SiO₂ layer (not shown) having a thickness of 1 μm is deposited above the previously formed SiNx passivation layer 43 (first stage) and the $p^+$-InP contact regions 4231 of the SWIR inorganic micro PD array 4 formed by PECVD are used as an insulation layer. Next, a second patterned negative photoresist layer (not shown) is formed on the second SiO₂ layer through photolithography, thereby partially exposing the second SiO₂ layer from the second patterned negative photoresist layer. Thereafter, the second SiO₂ layer that is exposed from the second patterned negative photoresist layer and the SiNx passivation layer 43 (first stage) below thereof are removed by dry-etching, thereby forming an array of through holes 430 (first stage) which are defined by the etched portions of the second SiO₂ layer and the SiNx passivation layer 43 (first stage), and each of which has a diameter of 3.5 μm and exposes a corresponding one of the $p^+$-InP contact regions 4231. The through holes 430 (first stage) are subsequently used to dispose Indium (In) solder bumps 46 thereinto. After that, a multilayer film of chromium (Cr)/AuZn (Cr/AuZn: 15 nm/120 nm) is deposited above the second patterned negative photoresist layer and the $p^+$-InP contact regions 4231 by thermal evaporation, and the thus deposited multilayer film of Cr/AuZn is formed into an array of P-metals (i.e., anodes 44) in the SWIR inorganic micro PD array 4. Finally, the S-doped $n^+$-InP(100) substrate 41, after completing the formation of the multilayer film of Cr/AuZn, is immersed in acetone until the multilayer film of Cr/AuZn disposed on the second patterned negative photoresist layer is peeled off, and then is immersed in a BOE solution so as to remove the second SiO₂ layer, followed by immersing in an ACE/IPA solution for 5 minutes, rinsing with deionized water for 3 minutes, drying with the nitrogen gun, and treating with UV/ozone at 120° C. for 30 minutes, thereby finalizing the formation of the array of P-metals 44 of the SWIR inorganic micro PD array 4.

After the completion of the P-metal deposition process of the SWIR inorganic micro PDs 4, an N-metal deposition process is implemented. Specifically, in the N-metal deposition process, a third $SiO_2$ layer (not shown) having a thickness of 1 μm is deposited on a lower surface 412 of the S-doped $n^+$-InP(100) substrate 41 of the arrays of SWIR inorganic micro PDs 4 by PECVD. Next, a third patterned negative photoresist layer (not shown) is formed on the third $SiO_2$ layer through photolithography, thereby partially exposing the third $SiO_2$ layer from the third patterned negative photoresist layer. Thereafter, the third $SiO_2$ layer exposed from the third patterned negative photoresist layer is removed by dry-etching, thereby forming through holes which expose the lower surface 412 of the S-doped $n^+$-InP (100) substrate 41 and which are defined by the etched portions of the third $SiO_2$ layer. After that, a multilayer film of Au/AuGe/Au (Au/AuGe/Au: 20 nm/100 nm/160 nm) is deposited above the third patterned negative photoresist layer and on the lower surface 412 of the S-doped $n^+$-InP (100) substrate 41 by thermal evaporation, and the deposited multilayer film of Au/AuGe/Au forms an N-metal (i.e., common cathode 45) in the SWIR inorganic micro PD array 4. Finally, the S-doped $n^+$-InP(100) substrate 41, after completing the formation of the multilayer film of Au/AuGe/Au, is immersed in acetone until the multilayer film of Au/AuGe/Au disposed on the third patterned negative photoresist layer is peeled off, and then is immersed in a BOE solution so as to remove the third $SiO_2$ layer, followed by immersing in an ACE/IPA solution for 5 minutes, rinsing with deionized water for 3 minutes, drying with the nitrogen gun, and treating with UV/ozone at 120° C. for 30 minutes, thereby finalizing the formation of the N-metal 45 of the SWIR inorganic micro PD array 4.

After completing the deposition of the P-metals 44 (i.e., the multilayer film of Cr/AuZn) and the N-metal 45 (i.e., the multilayer film of Au/AuGe/Au), the S-doped $n^+$-InP(100) substrate 41 of the SWIR inorganic micro PD array 4 is placed in an $N_2$ environment and annealed at 400° C. for 60 seconds. After the annealing of the P-metals 44 and the N-metal 45, an additional SiNx passivation layer 43 (second stage) is deposited on the previously formed SiNx passivation layer 43 (first stage) by PECVD. Next, a fourth patterned negative photoresist layer (not shown) is formed on the SiNx passivation layer 43 (second stage) through photolithography, thereby partially exposing the SiNx passivation layer 43 (second stage) from the fourth patterned negative photoresist layer. After that, the SiNx passivation layer 43 (second stage) exposed from the fourth patterned negative photoresist layer is removed by RIE, thereby forming the array of through holes 430 (second stage) for the SWIR inorganic micro PD array 4 which are defined by the etched portions of the SiNx passivation layer 43 (second stage) and each of which exposes a corresponding one of the P-metals 44 therefrom. Afterward, the fourth patterned negative photoresist layer is removed. Each of the through holes (second stage) of the arrays of SWIR inorganic micro PDs 4 is subsequently used to dispose a corresponding one of the In solder bumps 46 thereinto.

<Preparation of Micro LED Arrays>

Processing steps for fabricating a 512×512 mesa-type micro LED array are described as follows, and include the processing steps for fabricating the AlGaInP-based micro LED array 5 and the processing steps for fabricating the GaInN-based micro LED array 6.

Figure 3:
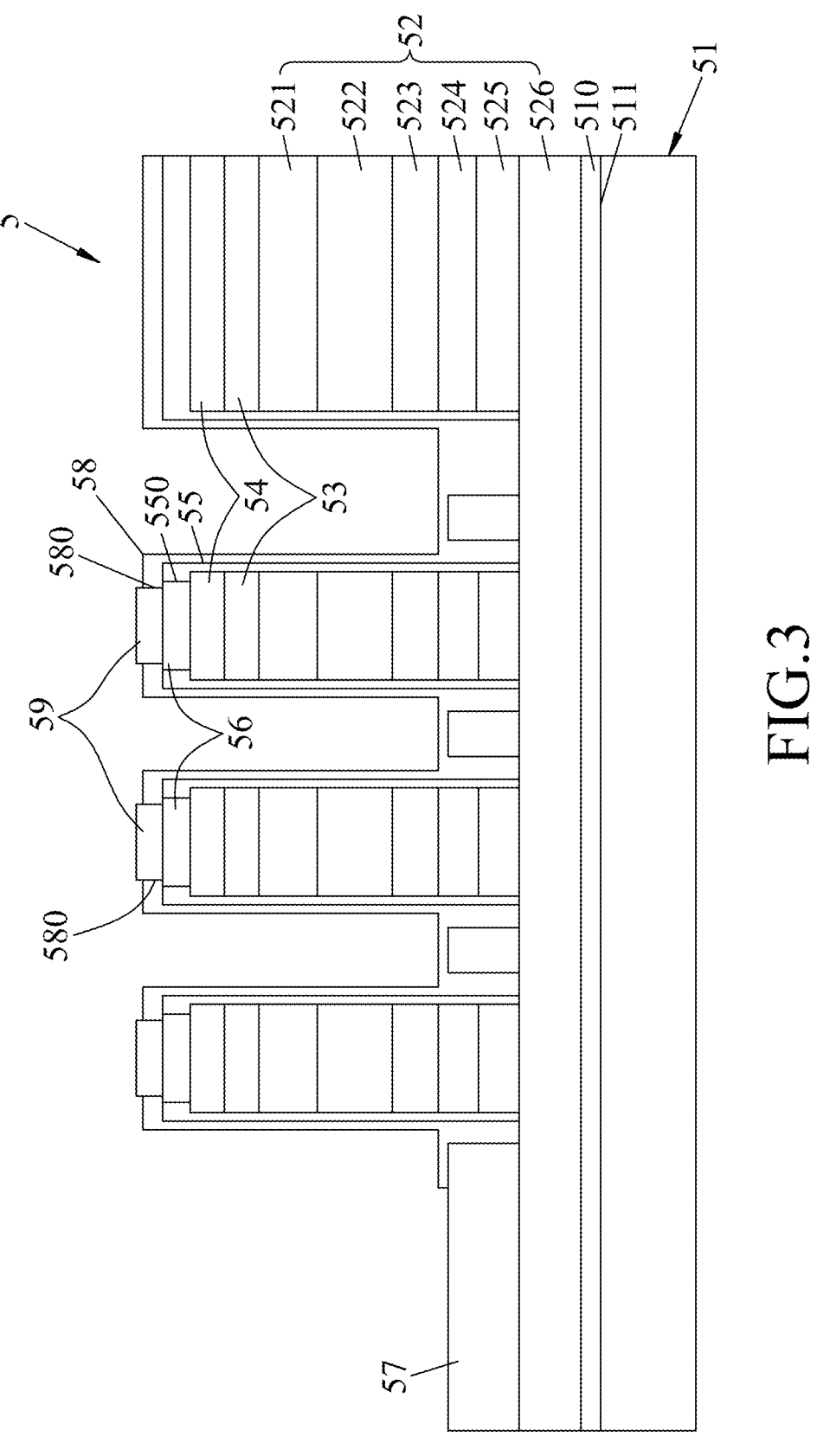
FIG. 3 is a cross-sectional view illustrating a film structure of an example of an AlGaInP-based micro light emitting diode (micro LED) array used in the all-inorganic up-conversion display of the embodiment shown in FIG. 1.

Referring to FIG. 3, in the fabrication of the AlGaInP-based micro LED array 5, a first film structure 52 is epitaxially grown on a surface of a 4-inch p-GaAs substrate (not shown) by MOCVD. To be specific, the first film structure 52 with n-side up includes, sequentially from bottom to top, an InGaP barrier layer (not shown) having a thickness of 0.4 μm, a p-GaAs ohmic contact layer 521 having a thickness of 0.2 μm, a p-AlGaInP electron cladding layer 522 having a thickness of 2 μm, a p-AlInP electron cladding layer 523 having a thickness of 0.5 μm, multiple quantum wells (MQWs) 524 with 5 pairs of AlInP/AlGaInP stacked alternately therein and having a thickness of 0.41 μm, an n-AlInP hole cladding layer 525 having a thickness of 0.55 μm, and an n-GaP ohmic contact layer 526 having a thickness of 1.5 μm. The AlGaInP of the AlInP/AlGaInP MQWs 524 is represented by a formula of $(Al_xGa_{1-x})_{0.52}In_{0.48}P$, and when the x thereof is 0.2, 0.3, and 0.4, light emitted from the MQWs 524 are respectively red light, orange light, and yellow light. After that, a $SiO_x$ thin film 510 is deposited on an upper surface of the n-GaP ohmic contact layer 526 and a surface 511 of a c-plane sapphire substrate 51, and then the $SiO_x$ thin film 510 disposed on the n-GaP ohmic contact layer 526 and the $SiO_x$ thin film 510 disposed on the c-plane sapphire substrate 51 are placed in face-to-face contact with each other and are wafer bonded at 370° C. under 13500 Kg for 90 minutes, thereby transferring the first film structure 52 onto the surface 511 of a c-plane sapphire substrate 51 as shown in FIG. 3. Afterward, the p-GaAs substrate is removed using a wet etchant ($NH_4OH$: $H_2O_2$) so that the InGaP barrier layer is exposed, and then the InGaP barrier layer is removed using a mixed acid etchant ($HCl:H_3PO_4$), followed by annealing under a nitrogen environment at a temperature of 200° C. for 15 minutes so as to relieve the stress generated during wafer bonding. Subsequently, chemical mechanical planarization (CMP) is performed to enhance the flatness of the first film structure 52 that has been transferred, thereby obtaining the first film structure 52 with p-side up.

Figure 4:
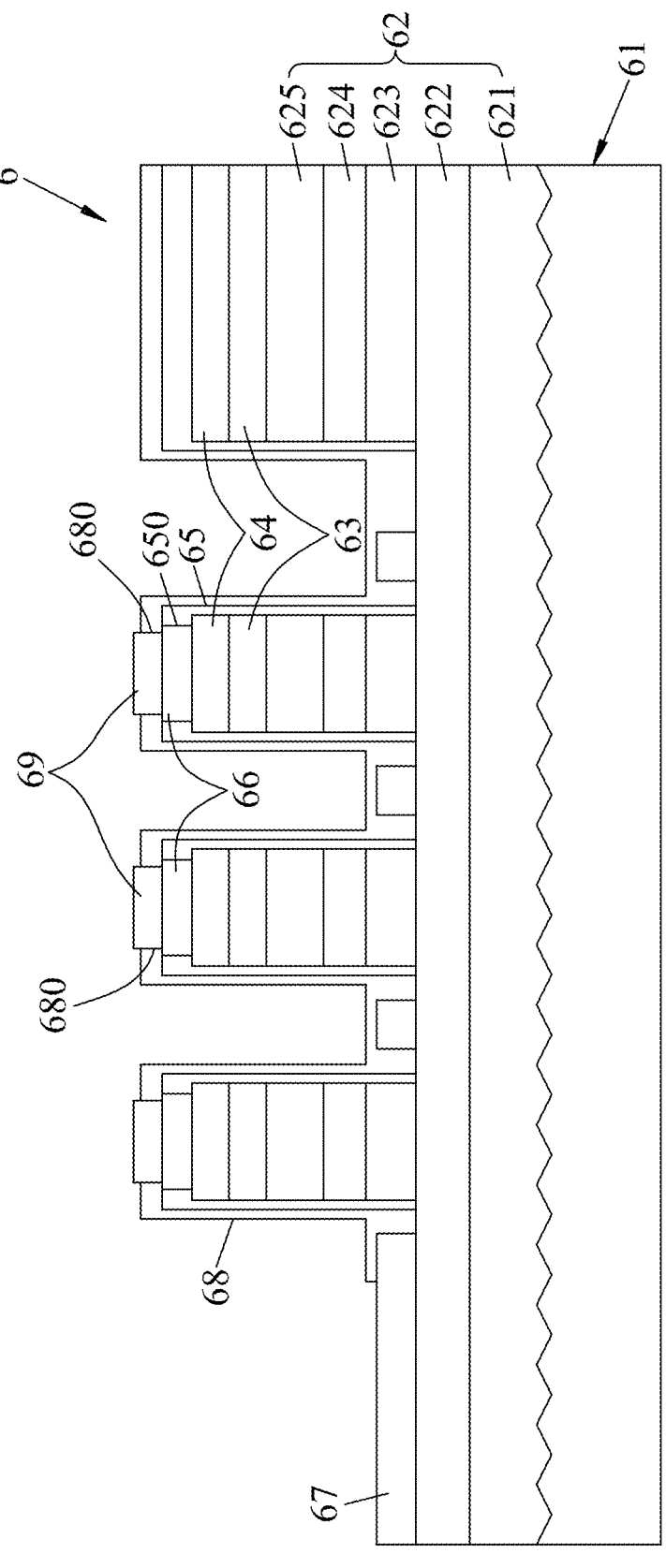
FIG. 4 is a cross-sectional view illustrating a film structure of an example of a GaInN-based micro LED array used in the all-inorganic up-conversion display of the embodiment shown in FIG. 1.

Referring to FIG. 4, in the fabrication of the GaInN-based micro LED array 6, a second film structure 62 having a thickness of 4 inch is epitaxially grown on a patterned c-plane sapphire substrate 61 by MOCVD. Specifically, the second film structure 62 includes, sequentially from bottom to top, an undoped GaN buffer layer 621 having a thickness of 0.5 μm, an $n^+$-GaN contact layer 622 (concentration of n impurity: $2\times10^{19}$ $cm^{-3}$) having a thickness of 2.5 μm, MQWs 623 with 5 pairs of InGaN/AlGaN stacked alternately therein and having a thickness of 0.315 μm, a p-AlGaN confinement layer 624 (concentration of p impurity: $8\times10^{16}$ $cm^{-3}$) having a thickness of 30 nm, and a p-GaN capping layer 625 (concentration of p impurity: $3\times10^{17}$ $cm^{-3}$) having a thickness of 0.1 μm. The InGaN of the InGaN/AlGaN within the MQWs 623 is represented by a formula of $In_{1-x}Ga_xN$, and when the x thereof is 0.25, 0.15, 0.11, and 0.08, light emitted from the MQWs 623 are respectively green light, blue light, purple light, and ultra-violet (UV)-A light.

Thereafter, the c-plane sapphire substrate 51 with the first film structure 52 transferred thereon and the pattered c-plane sapphire substrate 61 with the second film structure 62 grown thereon are immersed in an ACE/IPA solution for 5 minutes, and then rinsed with deionized water for 3 minutes, followed by drying utilizing the nitrogen gun.

A process for fabricating pixels of the 512×512 mesa-type micro LED array includes steps (1) to (5), which are described in detail as follows.

In step (1), the pixels of the AlGaInP-based micro LED array 5 and the GaInN-based micro LED array 6 are defined by a lithographic mask aligner (SUSS-MJB4). First, a patterned indium tin oxide (ITO) layer 53 and a patterned ITO layer 63, each of which has a thickness of 70 nm, are respectively deposited, by radio frequency sputtering (RF sputtering), on top of the p-GaAs ohmic contact layer 521 of the first film structure 52 (AlGaInP-based) and on top of the p-GaN capping layer 625 of the second film structure 62 (GaInN-based). The patterned ITO layers 53, 63 respectively serve as an ohmic contact layer of the first film structure 52 and an ohmic contact layer of the second film structure 62. Next, a patterned nickel (Ni) layer 54 and a patterned Ni layer 64, each of which has a thickness of 80 nm, are respectively deposited, by electron beam evaporation, on the patterned ITO layer 53 and the patterned ITO layer 63 to partially expose the p-GaAs ohmic contact layer 521 and the p-GaN capping layer 625, respectively, so that the patterned Ni layers 54, 64 can be used as hard masks for performing inductively coupled plasma reactive ion etching (ICP-RIE) subsequently.

In step (2), for the AlGaInP-based micro LED array 5, the ICP-RIE is conducted by using the patterned Ni layer 54 as a hard mask for the first film structure 52 and by etching, from the p-GaAs ohmic contact layer 521 in a direction toward the c-plane sapphire substrate 51, until the n-GaP ohmic contact layer 526 is exposed, so that a mesa structure is formed. For the GaInN-based micro LED array 6, the ICP-RIE is conducted by using the patterned Ni layer 64 as a hard mask for the second film structure 62 and by etching, from the p-GaN capping layer 625 in a direction toward the pattered c-plane sapphire substrate 61, until the n$^+$-GaN contact layer 622 is exposed, so that a mesa structure is formed. More specifically, the conditions of ICP-RIE for fabricating the AlGaInP-based micro LED array 5 include a bias power of 50 W, a $Cl_2$ flow of 5 sccm, a $BCl_3$ flow of 4 sccm, an ICP power of 200 W, an operating pressure of 0.8 Pa, an ambient temperature of 20° C., and an etch time period of 260 seconds. Moreover, the ICP-RIE conditions for fabricating the GaInN-based micro LED array 6 includes a bias power of 10 W, a $Cl_2$ flow of 50 sccm, an ICP power of 200 W, an operating pressure of 0.5 Pa, an ambient temperature of 20° C., and an etch time period of 8 minutes. During fabrication of each of the arrays of AlGaInP-based micro LEDs 5 and each of the arrays of GaInN-based micro LEDs 6 under the ICP-RIE conditions as mentioned above, the etching rate is estimated to be 7.5 nm/sec.

In step (3), for the AlGaInP-based micro LED array 5, a patterned $SiO_2$ layer 55 having a thickness of 1 μm is deposited on top of the mesa structure (i.e., on the patterned Ni layer 54) by PECVD. The patterned $SiO_2$ layer 55 defines an array of through holes 550 of the AlGaInP-based micro LED array 5 and exposes a bottom of the mesa structure (i.e., a top of the n-GaP ohmic contact layer 526). Each of the through holes 550 has a diameter of 3.5 μm and is used for placing an indium solder bump therein. For the GaInN-based micro LED array 6, a patterned $SiO_2$ layer 65 having a thickness of 1 μm is deposited on a top of the mesa structure (i.e., on the patterned Ni layer 64) by PECVD. The patterned $SiO_2$ layer 65 defines an array of through holes 650 of the GaInN-based micro LED array 6 and exposes a bottom of the mesa structure (i.e., a top of the n$^+$-GaN contact layer 622). Each of the through holes 650 has a diameter of 3.5 μm and is used for placing an indium solder bump therein. In order to permit the current to flow evenly and to reduce the series resistance of pixels of the AlGaInP-based micro LED array 5 as well as the GaInN-based micro LED array 6, in step (4), an n electrode of each of the AlGaInP-based micro LED array 5 and the GaInN-based micro LED array 6 is designed to have a gridlike pattern (i.e., common cathodes 57, 67), and is disposed on the n-GaP ohmic contact layer 526 or the n$^+$-GaN contact layer 622. To be specific, for the AlGaInP-based micro LED array 5, a p-electrode layer (made of AuBe having a thickness of 120 nm) is deposited, by thermal evaporation method, on top of the mesa structure (i.e., on the patterned Ni layer 54 above the p-GaAs ohmic contact layer 521) so that pixel anodes 56 (in an array) are formed respectively inside the through holes 550. An n-electrode layer (made of Au/AuGeNi/Au having a thickness of 20 nm/130 nm/150 nm) is deposited at the bottom of the mesa structure (i.e., above the n-GaP ohmic contact layer 526) by thermal evaporation, so as to form a common cathode 57. After deposition of the p-electrode and n-electrode layers, annealing at 400° C. for 30 seconds is performed. Moreover, for the GaInN-based micro LED array 6, pixel anodes 66 (made of Ti/Al/Ti/Au having a thickness of 30 nm/120 nm/40 nm/60 nm and arranged in an array) are respectively and directly deposited inside the through holes 650 formed on the top of the mesa structure (i.e., the patterned Ni layer 64), and a common cathode 67 (made of Ti/Al/Ti/Au having a thickness of 30 nm/120 nm/40 nm/60 nm) is deposited above the n$^+$-GaN contact layer 622. After that, annealing is conducted at 550° C. for 300 seconds.

In order to reduce leakage current caused by the damage arising from the ICP-RIE, in step (5), a patterned $Al_2O_3$ passivation layers 58 and a patterned $Al_2O_3$ passivation layers 68, each having a thickness of 300 nm, are respectively deposited for each of the AlGaInP-based micro LED array 5 and the GaInN-based micro LED array 6, by plasma-enhanced atomic layer deposition (PE-ALD). The patterned $Al_2O_3$ passivation layer 58 defines an array of through holes 580 that expose the array of pixel anodes 56, and the patterned $Al_2O_3$ passivation layers 68 defines an array of through holes 680 that expose the array of pixel anodes 66. In addition, an end of the common cathode 57 and an end of the common cathode 67 are respectively exposed from the patterned $Al_2O_3$ passivation layers 58 and the patterned $Al_2O_3$ passivation layers 68. Thus, the fabrication of the AlGaInP-based micro LED array 5 and the GaInN-based micro LED array 6 is completed.

<Flip-Chip Bonding of Micro PD Array to Micro LED Arrays>

In the 512×512 all-inorganic up-conversion display, each of the P-metals 44 of the SWIR inorganic micro PD array 4 is aligned with a corresponding one of the pixel anodes 56 of the AlGaInP-based micro LED array 5 or a corresponding one of the pixel anodes 66 of the GaInN-based micro LED array 6.

It is worth mentioning that in order to facilitate connection to external contacts, each of the AlGaInP-based micro LED arrays 5 and each of the GaInN-based micro LED arrays 6 are laser-cut into multiple small units each having a size of 18 mm×18 mm, and each of the SWIR inorganic micro PD arrays 4 is laser-cut into multiple small unit each having a size of 10 mm×10 mm. Thereafter, indium (In) layers having a thickness of 4 μm are deposited, utilizing electron beam evaporation, in the through holes 430 of the SWIR inorganic micro PD array 4, the through holes 580 of the AlGaInP-based micro LED array 5, and the through holes 680 of the GaInN-based micro LED array 6. As a result, the In solder bumps 46 (in an array) are respectively formed in the SWIR inorganic micro PD array 4, In solder bumps 59 (in an array) are respectively formed in the AlGaInP-based micro LED array 5, and In solder bumps 69 (in an array) are respectively formed in the GaInN-based micro LED array 6. Each of the In solder bumps 46 is in contact with a corresponding one of the P-metals 44, each of the In solder bumps 59 is in contact with a corresponding one of the pixel anode 56, and each of the In solder bumps 69 is in contact with the pixel anode 66. Subsequently, the In solder bumps 46, 59, 69 are subjected to a reflow process. In this exemplary embodiment, each of the In solder bumps 46, 59, 69 has an average electric resistance of 67 mΩ, based on a daisy-chain test.

It is obvious that from the above description, in the flip-chip bonding process, each of the small units of the SWIR inorganic micro PD array 4 is flip-chip bonded to a corresponding small unit of the AlGaInP-based micro LED array 5 or a corresponding small unit of the GaInN-based micro LED array 6.

In this exemplary embodiment, the 512×512 all-inorganic up-conversion display is accomplished utilizing a bonding apparatus (Model: SET FC150) to perform the flip-chip bonding process, which has a placement accuracy of ±0.5 μm and a post-bond accuracy of ±1 μm. Specifically, in this exemplary embodiment, the flip-chip bonding process is performed under a force increasing rate of 0.25 kg/s and a temperature increasing rate of 8.3° C./s. In addition, a force and a temperature used in a soak segment of the flip-chip bonding process are 245 N and 80° C., respectively, and such force and such temperature persist for 200 seconds simultaneously.

Figure 5:
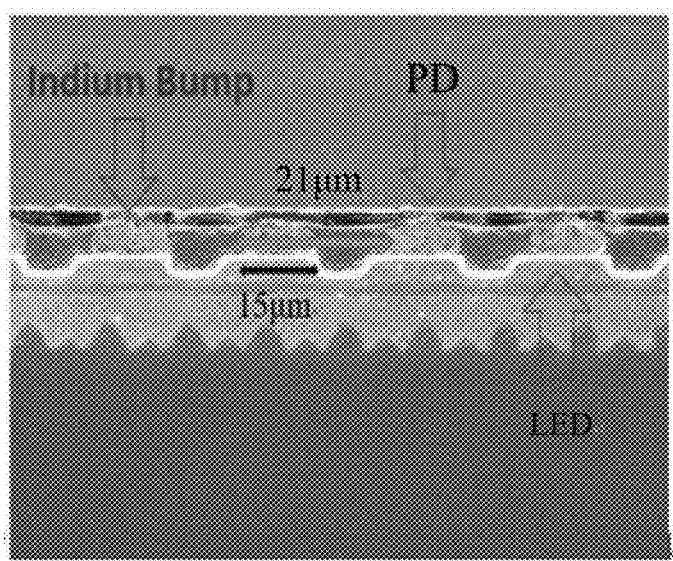
FIG. 5 is a field emission scanning electron microscope (FE-SEM) image illustrating Indium (In) solder bumps of the SWIR inorganic micro PD array and those of the GaInN based micro-LED array after flip-chip bonding.

Referring to FIG. 5, the SWIR inorganic micro PD array 4 is flip-chip bonded to one of the GaInN-based micro LED array 6, and each of the In solder bumps 46 located at a bottom of the of SWIR inorganic micro PD array 4 is precisely bonded to a corresponding one of the In solder bumps 69 located at a top of the GaInN-based micro LED array 6.

Figure 6:
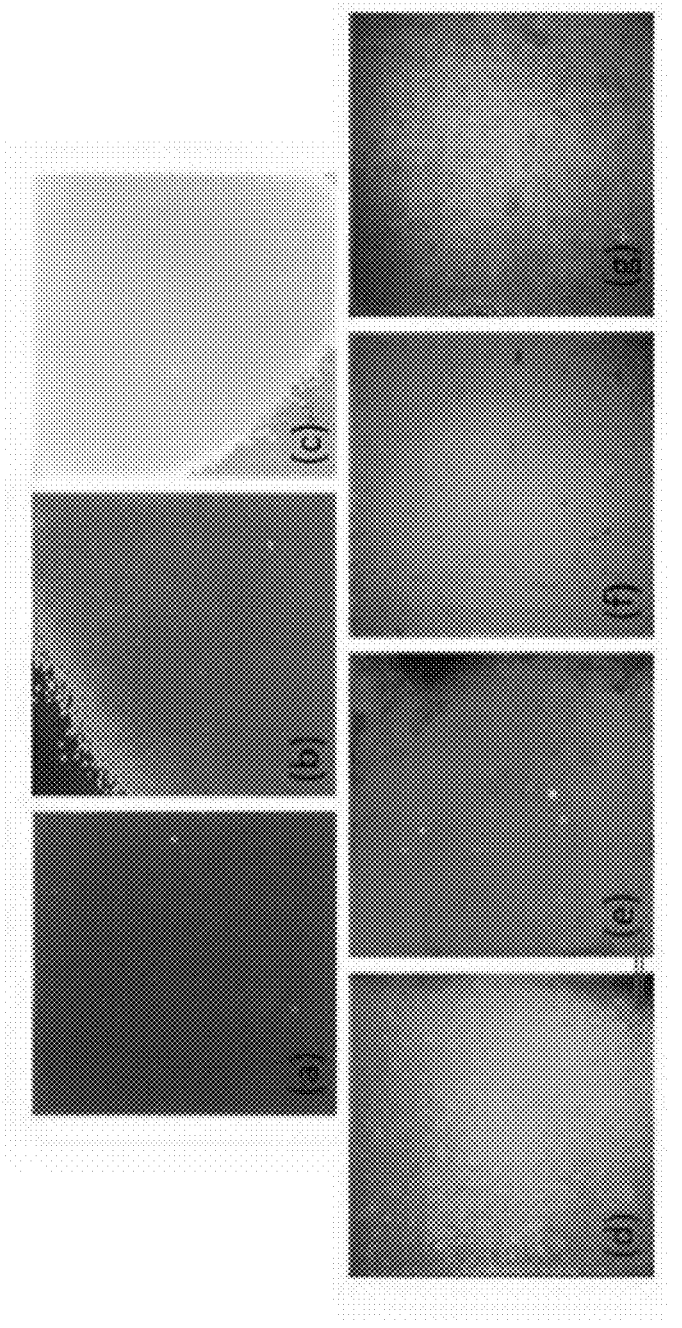
FIG. 6 are photograph images (a) to (g) respectively showing red, orange, yellow, green, blue, violet, and yellowish green color images generated by the 512×512 all-inorganic up-conversion display of the embodiment by excitation of laser light.

After the flip-chip bonding process, the pixel yield of the 512×512 all-inorganic up-conversion display is analyzed utilizing an Image J software, which is usually used to analyze full brightness images and calculate the number of pixels or the number of areas needed to be lit. FIG. 6 (*a*) to (*g*) respectively show a red color image, an orange color image, a yellow color image, a green color image, a blue color image, a purple color image, and a UV-A color image generated by the 512×512 all-inorganic up-conversion display, and each of such color images is excited by a laser light radiation having a wavelength of 1550 nm. Moreover, the operability of color images of the 512×512 all-inorganic up-conversion display are 99.8%, 93.5%, 90.4%, 95.0%, 95.0%, 95.5% and 92.7%, respectively indicating that, the surviving pixels of a total number of pixels, i.e., 262144 (or 512×512), after being flip-chip bonded, are 261620, 245105, 236978, 249037, 249037, 250348 and 243007, correspondingly and respectively.

Figure 7A:
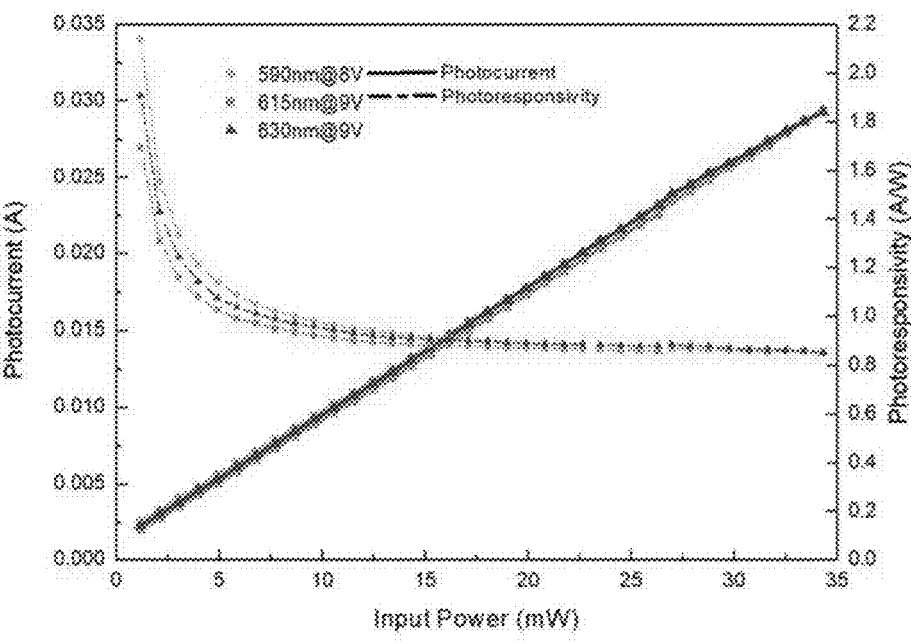
FIG. 7a are line graphs showing a relationship between a photocurrent and an input power of laser light as well as a relationship between a photoresponsivity and the input power of laser light of the 512×512 all-inorganic up-conversion displays, which were excited by a laser light having a wavelength of 1550 nm with bias powers of respectively 9 V, 9 V, and 8 V so as to emit a yellow light (590 nm), an orange light (615 nm) and a red light (630 nm), respectively.

Referring to FIG. 7*a*, it can be seen that when an input power of laser light is up to 35 mW, photocurrents of the 512×512 all-inorganic up-conversion display, either emitting a yellow light (590 nm), an orange light (615 nm) or a red light (630 nm), remain nearly constant and increase linearly to 29.3 Ma, and photoresponsivities thereof reach up to 0.83 A/W.

Figure 7B:
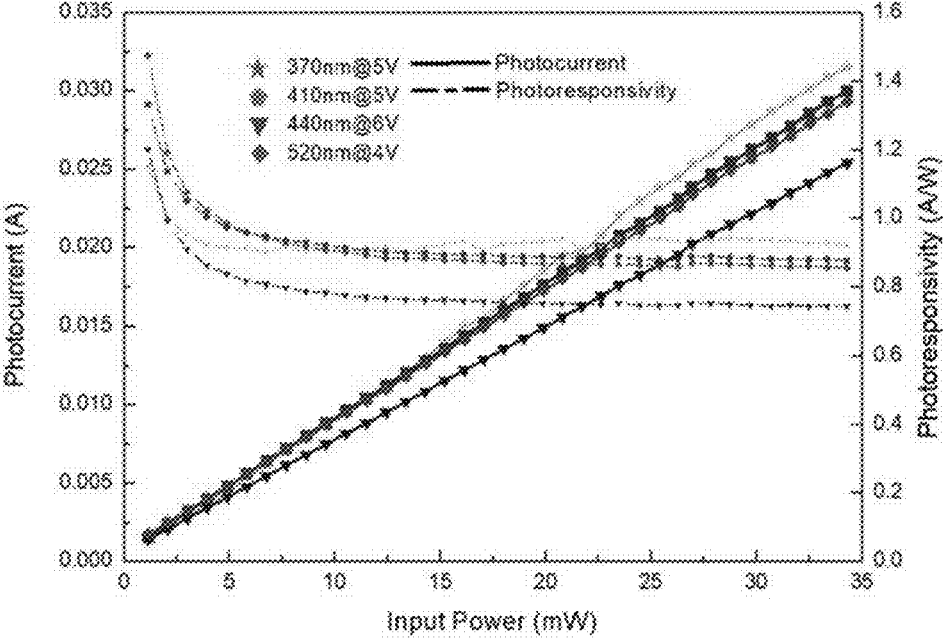
FIG. 7b are line graphs showing a relationship between a photocurrent and an input power of laser light as well as a relationship between a photoresponsivity and the input power of laser light of the 512×512 all-inorganic up-conversion displays, which were excited by a laser light having a wavelength of 1550 nm with bias powers of respectively 4 V, 6 V, 5 V and 5 V so as to emit an ultraviolet (UV)-A light (370 nm), a purple light (410 nm), a blue light (440 nm) and a green light (520 nm), respectively.

Referring to FIG. 7*b*, it can be seen that when an input power of laser light is up to 35 mW, photocurrents of the 512×512 all-inorganic up-conversion display, which respectively emit an UV-A light (370 nm), a purple light (410 nm), a blue light (440 nm), and a green light (520 nm), increase linearly to 31.5 mA, 30.0 mA, 25.4 mA, and 29.0 mA, and photoresponsivities thereof are 0.90 A/W, 0.86 A/W, 0.73 A/W and 0.83 A/W, respectively.

Figure 8A:
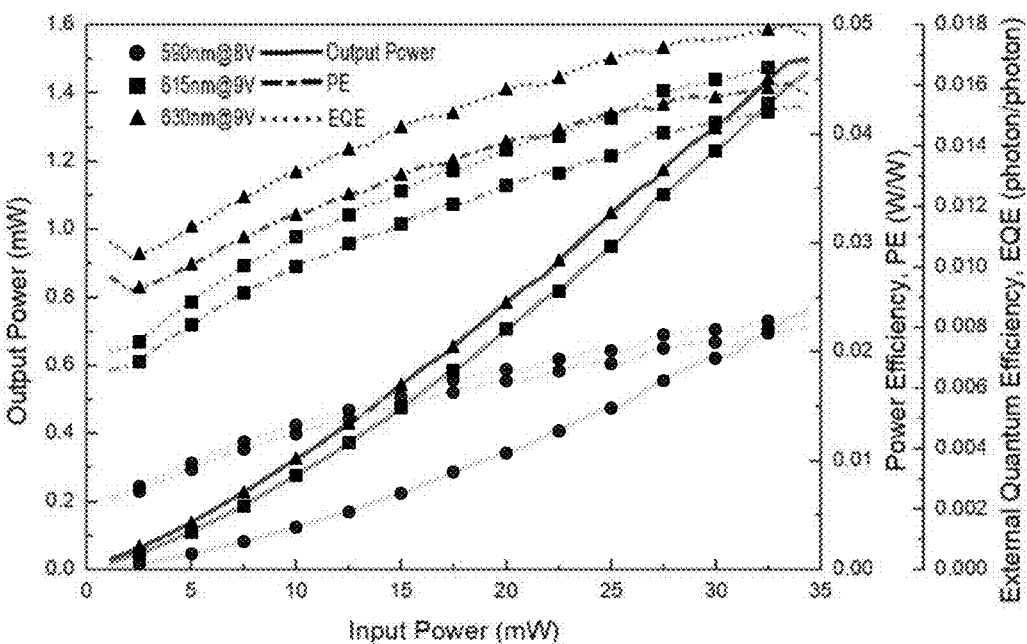
FIG. 8a are line graphs showing a relationship between an output power and an input power of laser light, a relationship between an external quantum efficiency and the input power of laser light, and a relationship between a power-to-power efficiency and the input power of laser light of the 512×512 all-inorganic up-conversion displays, which were excited by a laser light having a wavelength of 1550 nm with bias powers of respectively 9 V, 9 V, and 8 V so as to emit a yellow light (590 nm), an orange light (615 nm) and a red light (630 nm), respectively.

Referring to FIG. 8*a*, it can be seen that an output power increases almost linearly with an input power of laser light.

In addition, the output powers of the 512×512 all-inorganic up-conversion display which emit a yellow light (590 nm), an orange light (615 nm), and a red light (630 nm) reach up to 0.76 mW, 1.46 mW, and 0.50 mW, respectively, power-to-power efficiencies thereof are 4.22%, 4.2%, and 4.3%, respectively, and maximum external quantum efficacies thereof are 0.85%, 1.68% and 1.8%, respectively.

Figure 8B:
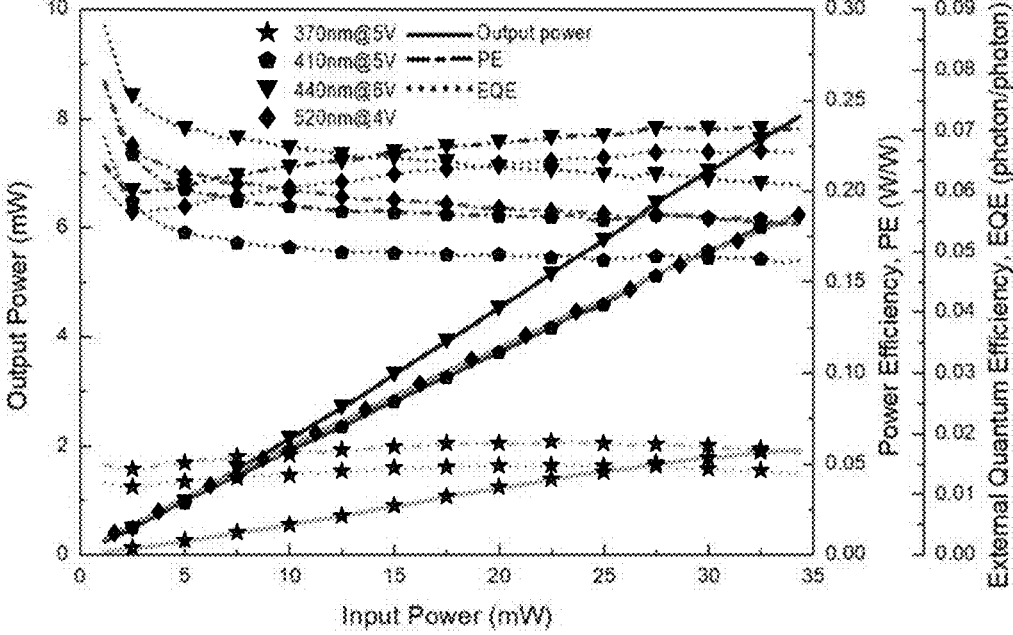
FIG. 8b are line graphs showing a relationship between an output power and an input power of laser light, a relationship between an external quantum efficiency and the input power of laser light, and a relationship between a power-to-power efficiency and the input power of laser light of the 512×512 all-inorganic up-conversion displays, which were excited by a laser light having a wavelength of 1550 nm with bias powers of respectively 5 V, 5 V, 6 V and 4 V so as to emit an UV light (370 nm), a purple light (410 nm), a blue light (440 nm), and a green light (520), respectively.

Referring to FIG. 8*b*, it can be seen that an output power increases almost linearly with an input power of laser light. Moreover, the output powers of the 512×512 all-inorganic up-conversion display which emit an UV light (370 nm), a purple light (410 nm), a blue light (440 nm), and a green light (520 nm), reach up to 1.93 mW, 6.31 mW, 8.01 mW, and 6.25 mW, respectively, power-to-power efficiencies thereof are 6.22%, 18%, 23.5%, and 6.25%, respectively, and maximum external quantum efficacies thereof are 1.5%, 6.9%, 8.7% and 6.7%, respectively.

As can be inferred from the aforesaid description on FIGS. 7 and 8, compared with the all-inorganic up-conversion display dominated by AlGaInP (i.e., that can emit the red light, the orange light and the yellow light), the all-inorganic up-conversion display dominated by GaInN (i.e., that can emit the green light, the blue light or the purple light) has higher photocurrent, higher photoresponsivity, higher output power, and higher power efficiency.

The light-to-light frequency response of the 512×512 all-inorganic up-conversion display of this exemplary embodiment is determined by a network analyzer (Agilent E5062A, 300 kHz to 3 GHz). The network analyzer provides a sine sweep frequency signal, and then connect the sine sweep frequency signal and a direct current (DC) bias to an EA-DFB module (purchased from Realphoton Co., Ltd.). After that, the EA-DFB module generates a laser light having a wavelength of 1550 nm with a signal therein. When the SWIR inorganic micro PD array 4 of the 512×512 all-inorganic up-conversion display receives the laser light, a photocurrent that carries the signal flow to a corresponding one of the AlGaInP-based micro LEDs or a corresponding one of the GaInN-based micro LEDs, thereby driving the corresponding AlGaInP-based micro LED or the corresponding GaInN-based micro LED. The light emitted from the AlGaInP-based micro LED array 5 or the GaInN-based micro LED array 6 is collected by an O/E photodiode (Graviton 850 nm SPA-3 2 GHz). Finally, the signal detected by the O/E photodiode is transmitted to the network analyzer, and an overall response of the 512×512 all-inorganic up-conversion display is then calculated.

Figure 9:
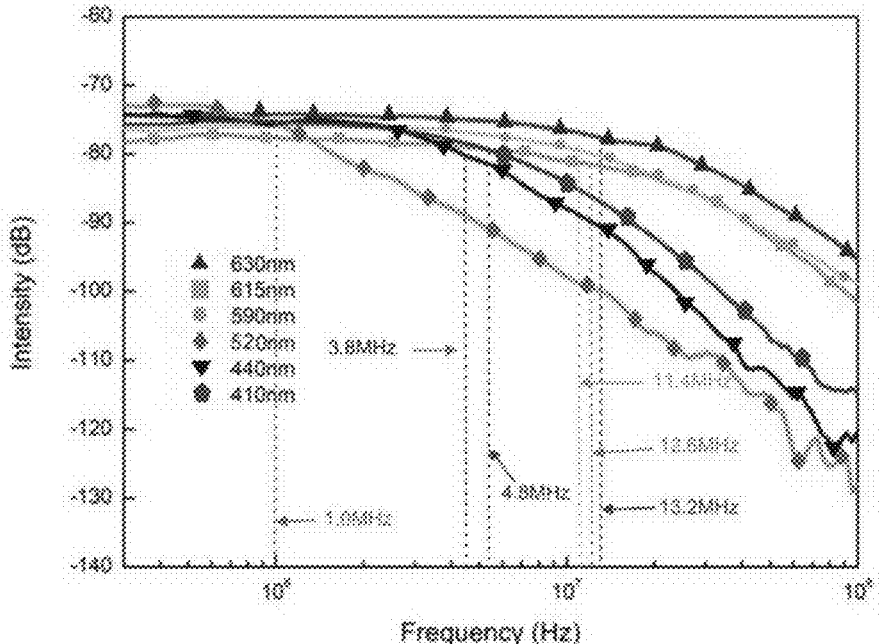
FIG. 9 are line graphs showing measured light-to-light frequency responses.

FIG. 9 shows light-to-light frequency responses of the 512×512 all-inorganic up-conversion display, which is excited by a laser light having a wavelength of 1550 nm and an input laser power of 7 dBm (5.01 mW) with bias powers of 9 V, 9 V, 8 V, 4 V, 6 V, and 5 V for emission of a red light (630 nm), an orange light (615 nm), a yellow light (590 nm), a green light (520 nm), a blue light (440 nm), and a purple light (410 nm), respectively. In the 512×512 all-inorganic up-conversion display where red, orange, yellow, green, blue, and purple colors are emitted, 3 dB frequency responses are exhibited at 13.2 MHz, 12.6 MHz, 11.4 MHz, 1.0 MHz, 3.8 MHz, 4.8 MHz, respectively. In addition, by analyzing the frequency response values shown in FIG. 9, (i.e., the frequency response of the SWIR inorganic micro PD array 4 obtained when an input power of the laser light having a wavelength of 1550 nm is 1 mW and a reverse bias is 10 V, and the frequency responses of the AlGaInP-based micro LED array 5 and the GaInN-based micro LED array 6 obtained when an input power of the laser light having a wavelength of 1550 nm is a forward current of 3 mA (data not shown)), it can be found that the 3 dB frequency response of the 512×512 all-inorganic up-conversion display is dominated by the 3 dB frequency response of the micro LED array (i.e., the arrays of AlGaInP-based micro LEDs 5 or the arrays of GaInN-based micro LEDs 6) rather than the f SWIR inorganic micro PD array 4.

Compared with a conventional all-inorganic up-conversion display which achieves 10 V, 240 kHz and 10 kHz upon irradiation with a laser light having a wavelength of 980 nm or 940 nm (see prior art documents as follows: (i) "Organic up-conversion imager with dual electronic and optical readouts for shortwave infrared light detection" published in Adv. Funct. Mater. 31, 2100565 (2021) by N. Li et al.; and (ii) "A high-performance solution-processed organic photodetector for near-infrared sensing" published in Adv. Mater. 32, 1906027 (2020) by J. F. Huang), the 3 dB frequency response, which is a MHz level and is shown by the 512×512 all-inorganic up-conversion display of this exemplary embodiment, achieves the highest record among all the up-conversion displays. It should be noted that numerous back-end applications of such up-conversion displays require a fast response speed that enables an accurate detection of a rapidly changing infrared signals in a visible light.

Application examples according to the disclosure that implement the embodiment shown in FIG. 1 are described hereinafter.

Figure 10:
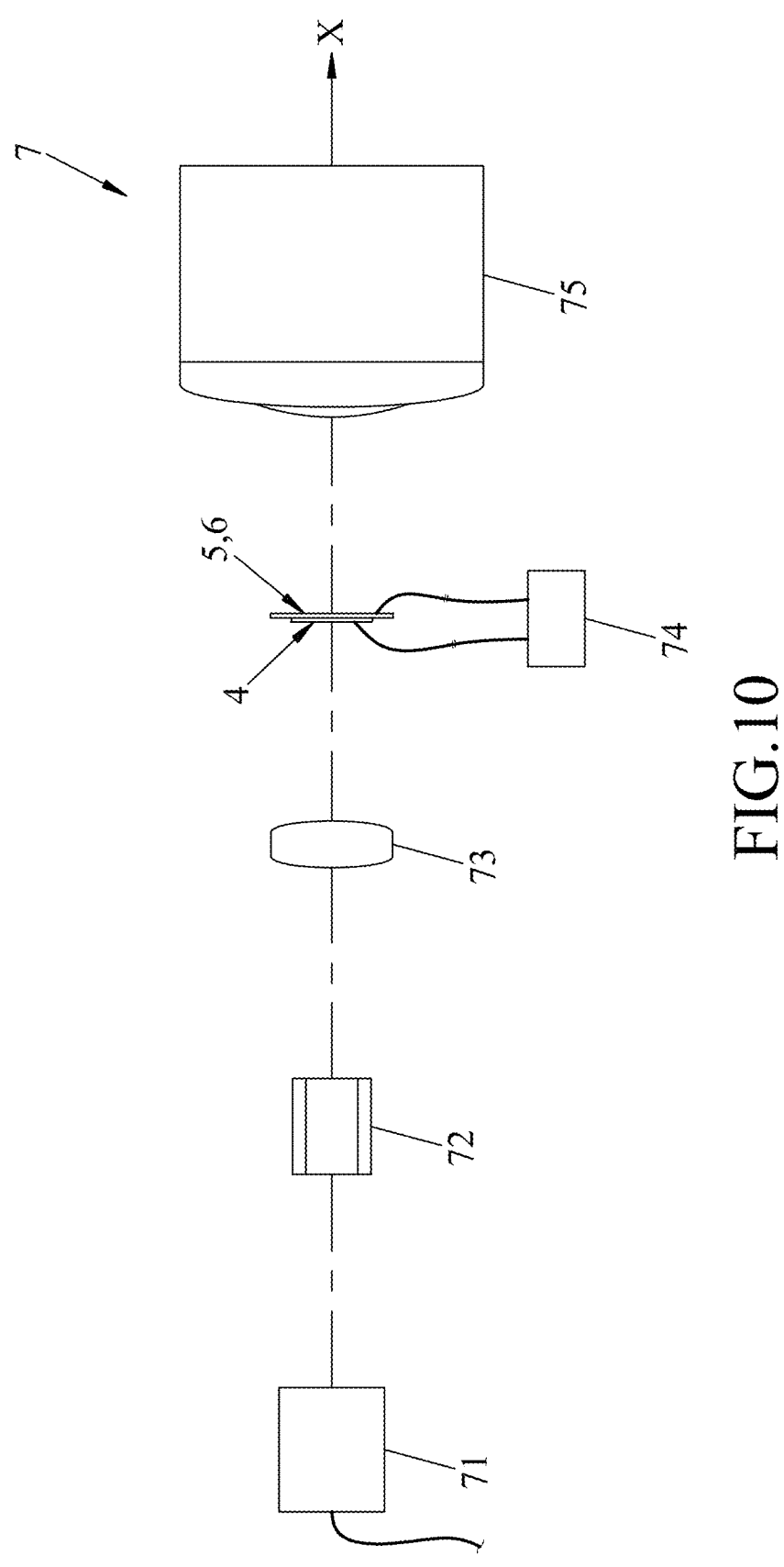
FIG. 10 is a schematic diagram showing a visible light imaging system.
Figure 11:
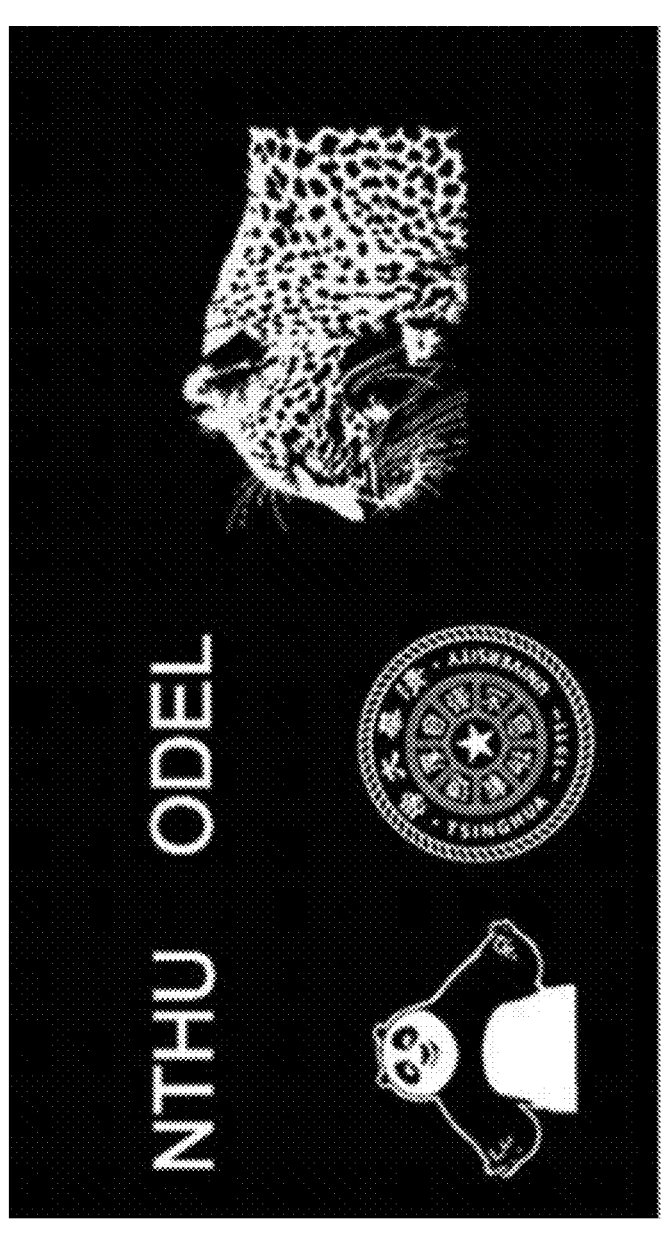
FIG. 11 shows patterns of shaped apertures of a black mask.
Figures 12, 13, 14:
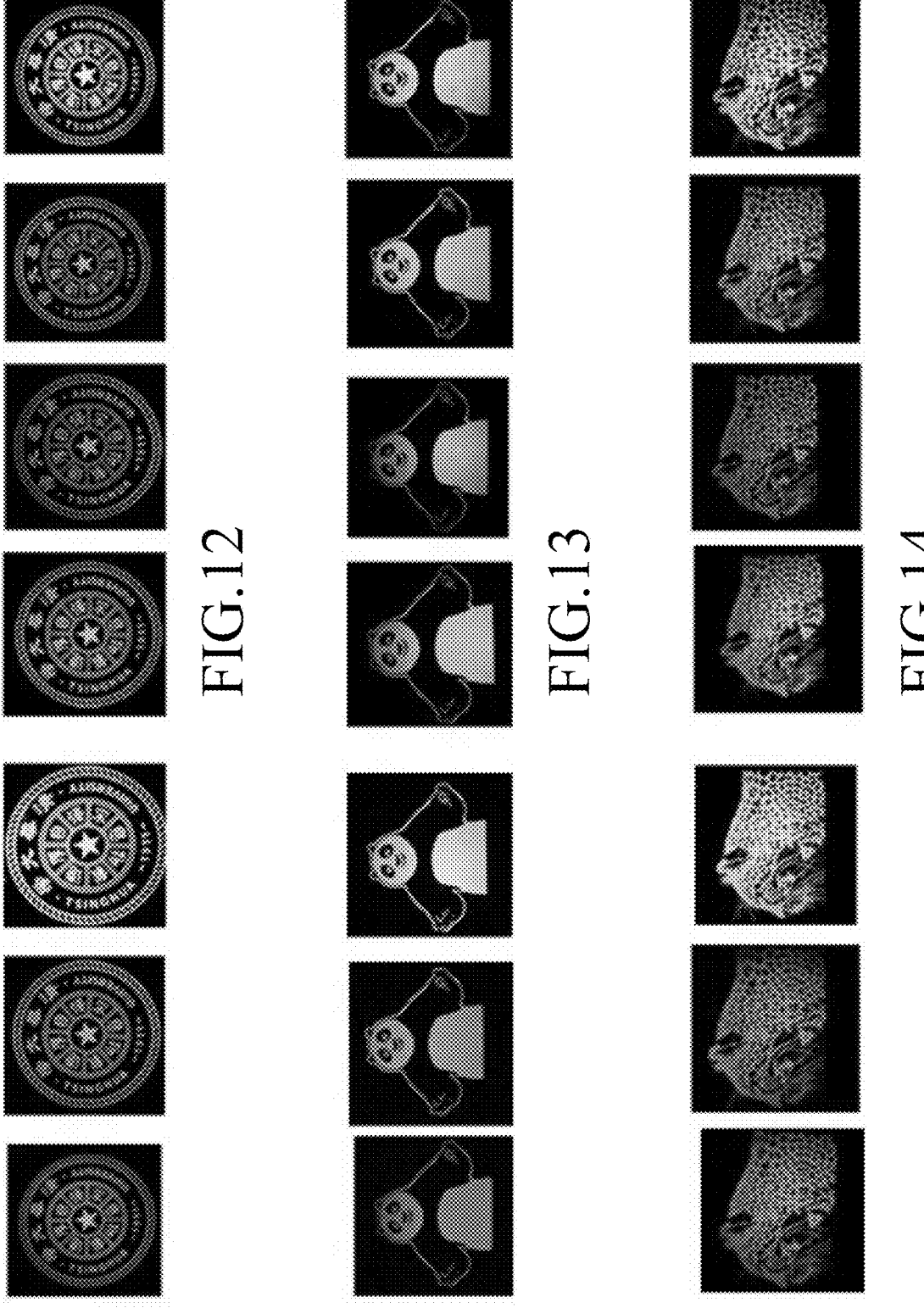
FIG. 12 shows a red light image, an orange light image, a yellow light image, a green light image, a blue light image, a purple light image, and an UV-A light image of a pattern of the school emblem of National Tsing Hua University obtained by a visible light imaging system having the 512×512 all-inorganic up-conversion displays with bias voltages of 9 V, 9 V, 8 V, 4 V, 6 V, 5 V, and 5 V, respectively.
FIG. 13 shows a red light image, an orange light image, a yellow light image, a green light image, a blue light image, a purple light image, and an UV-A light image of a pattern of a panda obtained by the visible light imaging system having the 512×512 all-inorganic up-conversion displays with bias voltages of 9 V, 9 V, 8 V, 4 V, 6 V, 5 V, and 5 V, respectively.
FIG. 14 shows a red light image, an orange light image, a yellow light image, a green light image, a blue light image, a purple light image, and an UV-A light image of a pattern of a leopard obtained by the visible light imaging system having the 512×512 all-inorganic up-conversion displays with bias voltages of 9 V, 9 V, 8 V, 4 V, 6 V, 5 V, and 5 V, respectively.
Figures 15, 16:
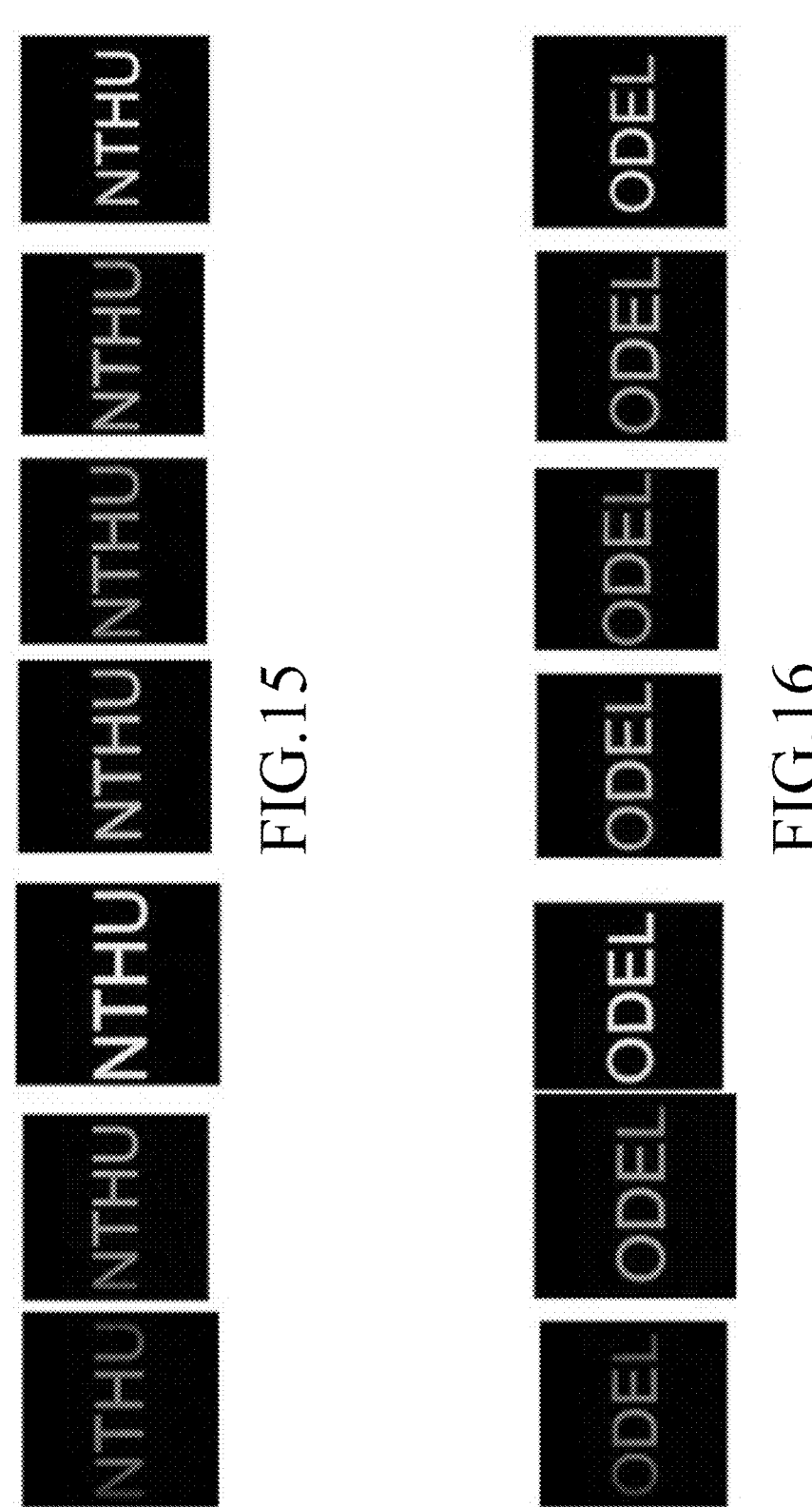
FIG. 15 shows a red light image, an orange light image, a yellow light image, a green light image, a blue light image, a purple light image, and an UV-A light image of a pattern of "NTHU" obtained by the visible light imaging system having the 512×512 all-inorganic up-conversion displays with bias voltages of 9 V, 9 V, 8 V, 4 V, 6 V, 5 V, and 5 V, respectively.
FIG. 16 shows a red light image, an orange light image, a yellow light image, a green light image, a blue light image, a purple light image, and an UV-A light image of a pattern of "ODEL" obtained by the visible light imaging system having the 512×512 all-inorganic up-conversion displays with bias voltages of 9 V, 9 V, 8 V, 4 V, 6 V, 5 V, and 5 V, respectively.

Referring to FIG. 10, an application example is a visible light imaging system 7. The visible light imaging system 7 sequentially includes, along an optical axis direction (X), an infrared (IR) laser device 71, a black mask 72, an IR lens 73, the 512×512 all-inorganic up-conversion display, a power supply 74 electrically connected to the 512×512 all-inorganic up-conversion display, and a camera 75. The power supply 74 provides a bias voltage to the SWIR inorganic micro PD array 4, and the AlGaInP-based micro LED array 5 and the GaInN-based micro LED array 6 of the 512×512 all-inorganic up-conversion display. To be specific, an IR laser light (wavelength: 1550 nm) emitted from the IR laser device 71 sequentially travels through, along the optical axis direction (X), a shaped aperture (e.g., a pattern of the school emblem of National Tsing Hua University (NTHU), a pattern of a panda, a pattern of a leopard, a pattern of "NTHU", a pattern of "ODEL", as shown in FIG. 11, of the black mask 72 and the IR lens 73. The light rays from an IR scene, after passing through the shaped aperture (similar to any of the aforementioned patterns) of the black mask 72, are collimated by the IR lens 73 into a uniform light beam which is directed forward to irradiate the SWIR inorganic micro PD array 4 of the 512×512 all-inorganic up-conversion display 4, so that the SWIR inorganic micro PD array 4 generates a photocurrent which subsequently flows from the In solder bumps 46 to the corresponding In solder bumps 59 of the AlGaInP-based micro LED array 5 or the corresponding In solder bumps 69 of the GaInN-based micro LED array 6. Thus, the AlGaInP-based micro LED array 5 or the GaInN-based micro LED array 6 display a visible light (red light, orange light, yellow light, green light, blue light, purple light, or UV-A light) image that is crystal clear and has the same shape as the shaped aperture (similar to the aforementioned patterns) of the black mask 72. The thus displayed visible light image is captured by a lens of the camera 75.

Figure 17:
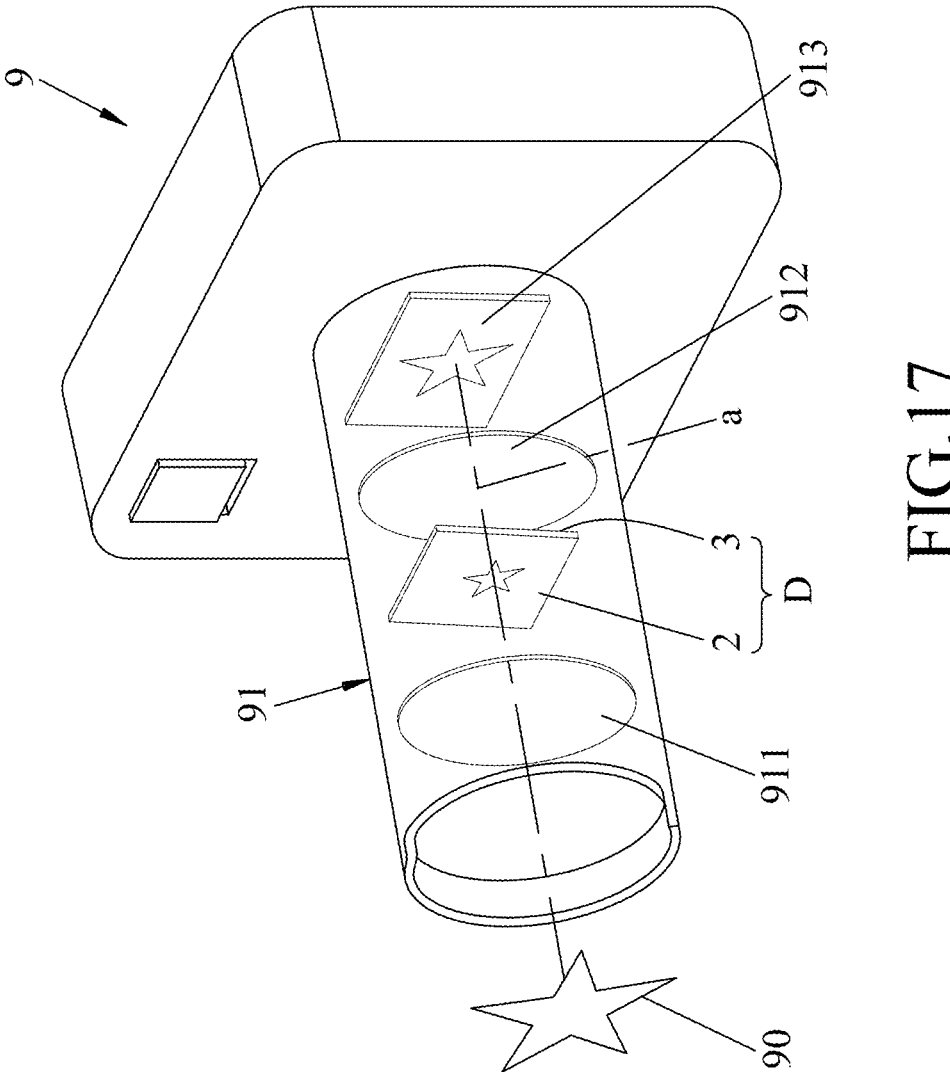
FIG. 17 is a schematic diagram illustrating an application of the all-inorganic up-conversion display according to the disclosure to a night camera.

Referring to FIGS. 12, 13, 14, 15, and 16, various color images generated by the 512×512 all-inorganic up-conversion display (red, orange, yellow, green, blue, purple, and UV-A color lights) are shown. It can be inferred that the resolution of the 512×512 all-inorganic up-conversion display in this application example is sufficiently superior to satisfy a variety of back-end applications such as, night cameras, night video cameras, night vision goggles, and wavelength converters. In another application example, the all-inorganic up-conversion display (D) of the embodiment according to the disclosure is implemented in a night camera 9 as shown in FIG. 17. A lens 91 of the night camera 9 sequentially includes, along a camera optical axis (a), an IR focusing lens 911, the all-inorganic up-conversion display (D) of the disclosure, a visible light focusing lens 912, and a complementary metal oxide semiconductor (CMOS) field effect transistor (FET) device 913. When an IR image 90 located outside of the lens 91 irradiates the lens 91 along the camera optical axis (a), the IR image 90 is focused by the IR focusing lens 911 and is then directed forward to the all-inorganic up-conversion display (D) so that the IR image 90 is inputted into a PD array 2 thereof to generate a photocurrent that subsequently flows to an LED array 3. Thus, the LED array 3 displays a visible light image (not shown) that was clear and has the same shape as the IR image 90. Afterward, the visible light image is focused through the visible light focusing lens 912, and is captured by the CMOS FET device 913.

Figure 18:
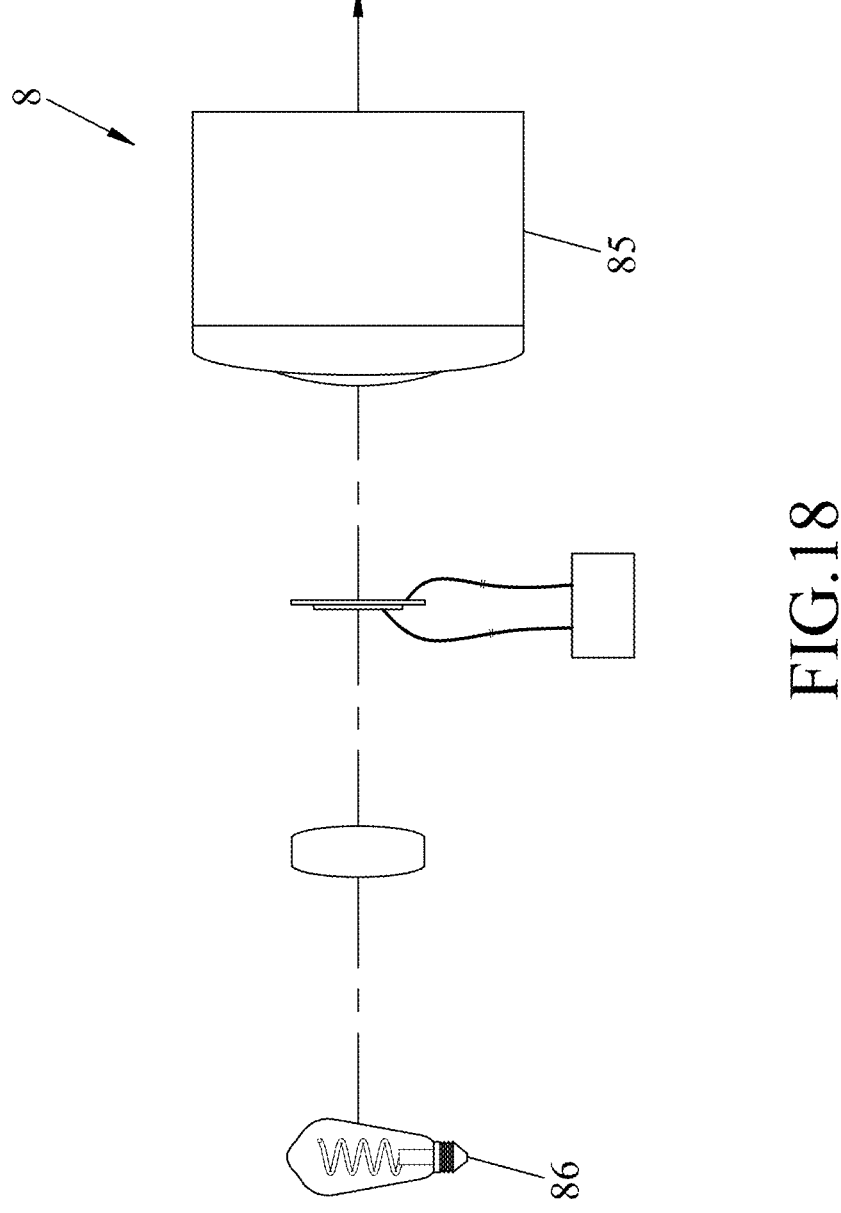
FIG. 18 is schematic diagram showing another visible light imaging system.

The undoped $In_{0.53}Ga_{0.47}As$ absorption layer 422 of the of SWIR inorganic micro PD array 4 of the embodiment according to the disclosure has an energy gap of 0.74 eV (or a cutoff wavelength of 1670 nm) at room temperature, indicating that the undoped $In_{0.53}Ga_{0.47}As$ absorption layer 422 can absorb a light having a wavelength equal to or less than 1670 nm, such as 1550 nm. Therefore, it is expected that the undoped $In_{0.53}Ga_{0.47}As$ absorption layer 422 can absorb a visible light that has a relatively shorter wavelength. Accordingly, the disclosure further provides an additional visible light imaging system 8 (see FIG. 18) which was substantially similar to the visible light imaging system 7, except that in the visible light imaging system 8, the black mask 72 is omitted and the IR laser device 71 is substituted by a tungsten bulb 86.

Figure 19:
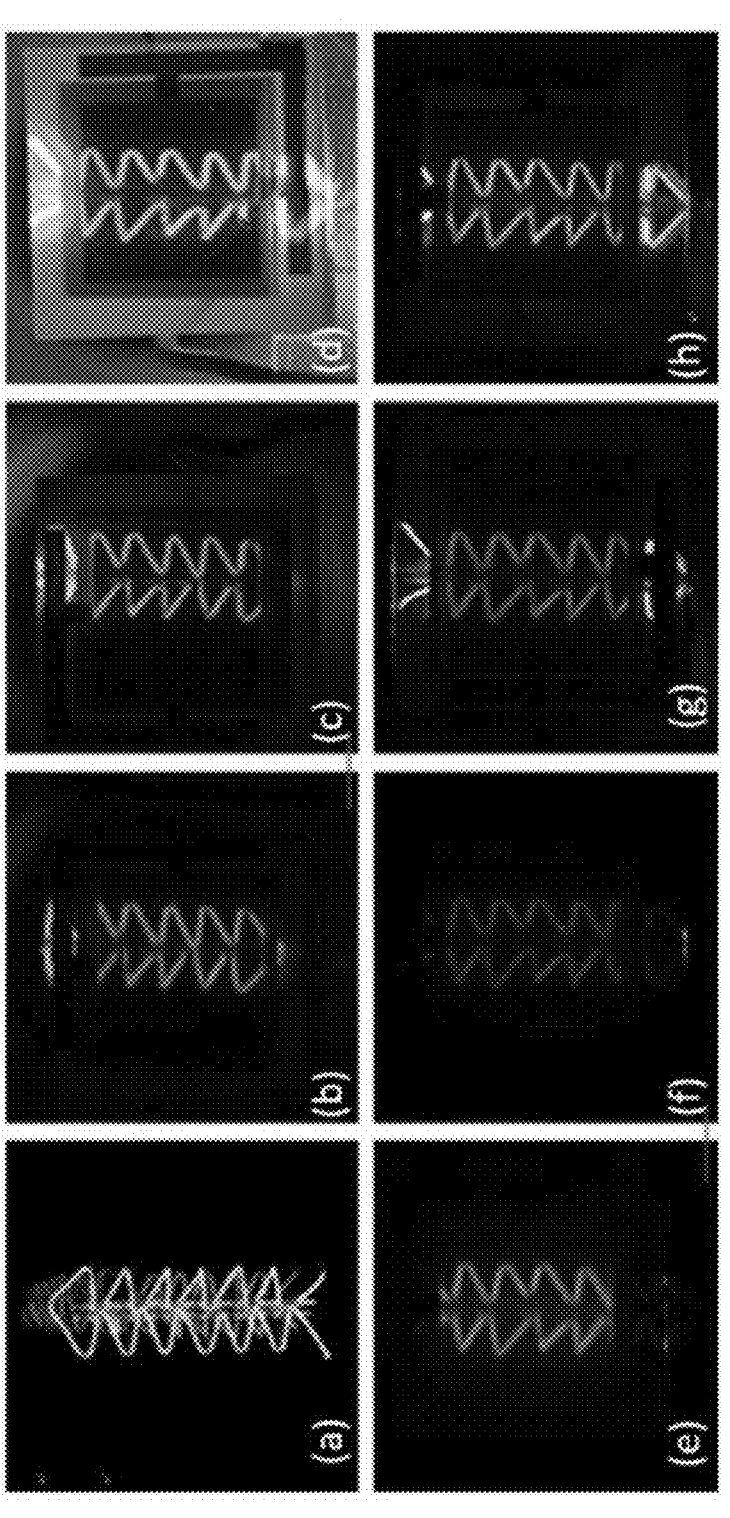
FIG. 19 shows an original light image (a), a red light image (b), an orange light image (c), a yellow image (d), a green light image (e), a blue light image (f), a purple light image (g), and an UV-A light image (h) that were emitted by a tungsten bulb in each of the 512×512 all-inorganic up-conversion displays under bias voltages of 0 V, 9 V, 9 V, 8 V, 4 V, 6 V, 5 V, and 5 V, respectively.

Referring to FIG. 19 (*a*) to (*h*), various color images obtained using a camera 85 of the visible light imaging system 8 are shown. The color images (a) to (h) are respectively an original light image, a red light image, an orange light image, a yellow image, a green light image, a blue light image, a purple light image, and an UV-A light image, and are emitted by a tungsten bulb in the 512×512 all-inorganic up-conversion display under a bias of 0 V, 9 V, 9 V, 8 V, 4 V, 6 V, 5 V, and 5 V, respectively.

In view of the above description, it is known that through the flip-chip bonding process, the SWIR inorganic micro PD array 4 is bonded to the AlGaInP-based micro LED array 5 and the GaInN-based micro LED arrays 6 so as to form the 512×512 all-inorganic up-conversion display whose lowest driving voltage is merely 4 V and light-to-light frequency response is 3 dB that is at the MHz level. A photocurrent, a photoresponsivity, an output power, and a power supply efficiency attained by the 512×512 all-inorganic up-conversion display can reach up to 31.5 mA, 0.9 A/W, 8.01 mW, and 23.5%, respectively.

To sum up, by having the separate substrates 21, 31 of the photodiode array 2 and the light emitting diode array 3, the all-inorganic up-conversion display (D) according to the disclosure does not have the problem of lattice mismatch between the photodiode array 2 and the light emitting diode array 3. In addition, because the first solder bumps 28 of the photodiode array 2 are flip-chip bonded to the corresponding second solder bumps 35 of the light emitting diode array 3, the issue of lattice mismatch can further be resolved. Furthermore, because both the photodiode array 2 and the light emitting diode array 3 are made of inorganic semiconductor materials, the all-inorganic up-conversion display (D) has a low driving voltage, a light-to-light frequency response of 3 dB that is at the MHz level, and excellent photocurrent, photoresponsivity, output power of light, and power supply efficiency.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An all-inorganic up-conversion display, comprising:
a photodiode array including a first substrate having a first conductivity type, a buffer layer formed on a first surface of said first substrate, an absorption layer formed on said buffer layer, a cap layer formed on said absorption layer, a first patterned passivation layer formed on said cap layer and exposing an array of contact regions of said cap layer, a common first electrode connected to said first substrate, an array of second electrodes, and an array of first solder bumps, said common first electrode having the first conductivity type, each of said contact regions of said cap layer having a second conductivity type that is opposite to the first conductivity type, each of said second electrodes being connected to a corresponding one of said contact regions and having the second conductivity type, and each of said first solder bumps being connected to a corresponding one of said second electrodes; and
a light emitting diode array including a second substrate, an array of luminous chips, a common third electrode, a second patterned passivation layer, and an array of second solder bumps, each of said luminous chips including a first semiconductor layer formed on said second substrate and having the first conductivity type, a second semiconductor layer formed on said first semiconductor layer and having the second conductivity type, an active layer disposed between said first semiconductor layer and said second semiconductor layer, and a pixel electrode having the second conductivity type and electrically connected to said second semiconductor layer, said first semiconductor layers of said luminous chips being connected to one another, said common third electrode having said first conductivity type being disposed on said first semiconductor layers of said luminous chips, and surrounding each of said active layers, said second patterned passivation layer covering said array of said luminous chips and said common third electrode and exposing each of said pixel electrodes of said luminous chips and an end of said common third electrode, and each of said second solder bumps being connected to a corresponding one of said pixel electrodes;
wherein each of said first solder bumps is flip-chip bonded to a corresponding one of said second solder bumps.

2. The all-inorganic up-conversion display as claimed in claim 1, wherein said first common electrode of said photodiode array is formed on a second surface of said first substrate opposite to said first surface.

3. The all-inorganic up-conversion display as claimed in claim 1, wherein each of said luminous chips further includes a current spreading layer, said current spreading layer being disposed between said pixel electrode and said second semiconductor layer.

4. The all-inorganic up-conversion display as claimed in claim 1, wherein the first conductivity type of said first substrate is n-type, the second conductivity type in each of said contact regions of said cap layer of said photodiode array is p-type, said common second electrode of said photodiode array is a common cathode, and each of said first electrodes of said photodiode array is an anode.

5. The all-inorganic up-conversion display as claimed in claim 1, wherein the first conductivity type in each of said first semiconductor layers of said array of said luminous chips is n-type, the second conductivity type in each of said second semiconductor layers of said arrays of luminous chips is p-type, said common third electrode of said light emitting diode array is a common cathode, and said pixel electrode of each of said luminous chips is a pixel anode.

6. The all-inorganic up-conversion display as claimed in claim 1, wherein each of said first solder bumps and said second solder bumps is made of a metal material selected from the group consisting of indium, gold, tin, a gold-indium alloy, a gold-tin alloy, an indium-tin alloy, a gold-indium-tin alloy, a tin-lead alloy, a gold-germanium alloy, and a gold-silicon alloy.

7. The all-inorganic up-conversion display as claimed in claim 1, wherein said photodiode array is one of a mini photodiode array and a micro photodiode array, and said light emitting diode array is one of a mini light emitting diode array and a micro light emitting diode array.

8. The all-inorganic up-conversion display as claimed in claim 1, wherein said absorption layer of said photodiode array is an undoped $In_{0.53}Ga_{0.47}As$ absorption layer.

* * * * *